(12) United States Patent
Chang et al.

(10) Patent No.: US 11,688,655 B2
(45) Date of Patent: *Jun. 27, 2023

(54) SEMICONDUCTOR PACKAGE INCLUDING LID STRUCTURE WITH OPENING AND RECESS

(71) Applicant: MEDIATEK INC., Hsinchu (TW)

(72) Inventors: Chia-Cheng Chang, Hsinchu (TW); Tzu-Hung Lin, Hsinchu (TW); I-Hsuan Peng, Hsinchu (TW); Nai-Wei Liu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/182,525

(22) Filed: Feb. 23, 2021

(65) Prior Publication Data

US 2021/0175137 A1   Jun. 10, 2021

Related U.S. Application Data

(63) Continuation of application No. 16/002,138, filed on Jun. 7, 2018, now Pat. No. 10,957,611.

(Continued)

(51) Int. Cl.
*H01L 23/053* (2006.01)
*H01L 23/16* (2006.01)
(Continued)

(52) U.S. Cl.
CPC ............ *H01L 23/053* (2013.01); *H01L 23/04* (2013.01); *H01L 23/16* (2013.01);
(Continued)

(58) Field of Classification Search
CPC ....... H01L 23/5383; H01L 2224/24137; H01L 2924/3511; H01L 2924/19105;
(Continued)

(56) References Cited

U.S. PATENT DOCUMENTS 9,269,694 B2   2/2016   Chen et al.
9,583,415 B2   2/2017   Yu et al.
(Continued)

FOREIGN PATENT DOCUMENTS

CN   104347544 A   2/2015
CN   104701287 A   6/2015

OTHER PUBLICATIONS

Chinese language office action dated Jul. 15, 2020, issued in application No. CN 201810837592.0.
(Continued)

*Primary Examiner* — Shahed Ahmed
*Assistant Examiner* — Khatib A Rahman
(74) *Attorney, Agent, or Firm* — McClure, Qualey & Rodack, LLP

(57) ABSTRACT

A semiconductor package structure including a package substrate, at least one semiconductor die, a lid structure, a first electronic component and a heat sink is provided. The package substrate has a first surface and a second surface opposite to the first surface. The semiconductor die is on the first surface of the package substrate and is surrounded by an encapsulating layer. The lid structure surrounds and is spaced apart from the encapsulating layer. The lid structure includes a first opening that is covered by the first surface of the package substrate. The first electronic component is over the first surface of the package substrate and arranged within the first opening of the lid structure. The heat sink covers the lid structure and the semiconductor die.

19 Claims, 19 Drawing Sheets

Related U.S. Application Data

(60) Provisional application No. 62/539,585, filed on Aug. 1, 2017.

(51) Int. Cl.

| | | |
|---|---|---|
| *H01L 23/31* | (2006.01) | |
| *H01L 23/367* | (2006.01) | |
| *H01L 23/498* | (2006.01) | |
| *H01L 23/538* | (2006.01) | |
| *H01L 25/16* | (2023.01) | |
| *H01L 23/00* | (2006.01) | |
| *H01L 25/065* | (2023.01) | |
| *H01L 23/04* | (2006.01) | |
| *H01L 25/18* | (2023.01) | |
| *H01L 23/433* | (2006.01) | |
| *H01L 23/373* | (2006.01) | |

(52) U.S. Cl.
CPC ...... *H01L 23/3128* (2013.01); *H01L 23/3675* (2013.01); *H01L 23/49816* (2013.01); *H01L 23/5383* (2013.01); *H01L 23/5386* (2013.01); *H01L 24/24* (2013.01); *H01L 25/0655* (2013.01); *H01L 25/165* (2013.01); *H01L 25/18* (2013.01); *H01L 23/367* (2013.01); *H01L 23/3737* (2013.01); *H01L 23/4334* (2013.01); *H01L 2224/24137* (2013.01); *H01L 2924/19105* (2013.01); *H01L 2924/3511* (2013.01)

(58) Field of Classification Search
CPC ......... H01L 23/04; H01L 23/16; H01L 23/31; H01L 23/3121; H01L 23/315; H01L 23/3675; H01L 25/0655; H01L 23/4334; H01L 23/053; H01L 23/3128; H01L 23/49816; H01L 23/5386; H01L 24/24; H01L 25/165; H01L 25/18; H01L 23/367; H01L 23/3737; H01L 2224/16225; H01L 2224/32225; H01L 2224/73204; H01L 23/49811

See application file for complete search history.

(56) References Cited

U.S. PATENT DOCUMENTS

| | | | |
|---|---|---|---|
| 9,627,346 B2* | 4/2017 | Hsu | H01L 23/3128 |
| 10,181,449 B1 | 1/2019 | Chen et al. | |
| 10,366,968 B2* | 7/2019 | Reingruber | H01L 24/14 |
| 10,461,009 B2 | 10/2019 | Hung et al. | |
| 2003/0085475 A1 | 5/2003 | Im et al. | |
| 2003/0178722 A1 | 9/2003 | Xie et al. | |
| 2005/0026331 A1 | 2/2005 | Chiu | |
| 2009/0200659 A1 | 8/2009 | Tosaya et al. | |
| 2010/0276799 A1 | 11/2010 | Heng et al. | |
| 2011/0018125 A1* | 1/2011 | Loo | H01L 23/16 257/E23.101 |
| 2013/0043581 A1 | 2/2013 | Negoro | |
| 2014/0061893 A1 | 3/2014 | Saeidi et al. | |
| 2015/0035134 A1* | 2/2015 | Hung | H01L 25/50 257/712 |
| 2016/0133602 A1* | 5/2016 | Chen | H01L 21/52 438/107 |
| 2017/0110413 A1* | 4/2017 | Chen | H01L 23/3107 |
| 2019/0148261 A1* | 5/2019 | Wu | H01L 24/32 257/684 |
| 2019/0237406 A1* | 8/2019 | Choi | H01L 25/16 |

OTHER PUBLICATIONS

European Office Action dated Apr. 20, 2021 in EP application No. 18 181 964.4.

* cited by examiner

SEMICONDUCTOR PACKAGE INCLUDING LID STRUCTURE WITH OPENING AND RECESS

CROSS REFERENCE TO RELATED APPLICATIONS

This application is a Continuation of U.S. patent application Ser. No. 16/002,138, filed on Jun. 7, 2018, now U.S. Pat. No. 10,957,611, which claims the benefit of U.S. Provisional Application No. 62/539,585 filed on Aug. 1, 2017, the entirety of which is incorporated by reference herein.

BACKGROUND OF THE INVENTION

Field of the Invention

The present invention relates to a semiconductor package, and in particular to a semiconductor package that includes a lid structure with an opening or recess.

Description of the Related Art

In the semiconductor packaging industry, there is a desire to reduce the cost of packaging semiconductor dies. To accomplish this, a wide variety of package structure designs have been developed. One of the package structure designs currently in use is the flip-chip package structure.

In a flip-chip package structure, a semiconductor die (also referred to as an integrated circuit (IC) chip or "chip") that is formed with solder bumps is typically bonded directly to metal pads of a package substrate. Such solder bumps are affixed to I/O bonding pads of the semiconductor die. During packaging, the semiconductor die is "flipped" so that the solder bumps form electrical interconnections between the semiconductor die and the packaging substrate. Flip chip package technology provides higher-speed electrical performance than earlier wire bond technology, since this greatly shortens the interconnection path between the semiconductor die and the package substrate.

In order to ensure the continued miniaturization and multi-functionality of electronic products and communication devices, it is desired that flip chip packages are small in size, operate at high speeds, and have high functionality. However, once fabrication gets too complicated, package warpage and thermal dissipation issues become challenges for the fabrication of flip chip packages. Although existing methods for fabricating flip chip packages have been generally adequate for their intended purposes, they have not been entirely satisfactory in every respect.

Thus, a novel semiconductor package structure is desirable.

BRIEF SUMMARY OF THE INVENTION

Semiconductor package structures are provided. An exemplary embodiment of a semiconductor package structure includes a package substrate, at least one semiconductor die, a lid structure, a first electronic component and a heat sink. The package substrate has a first surface and a second surface opposite to the first surface. The semiconductor die is on the first surface of the package substrate and surrounded by an encapsulating layer. The lid structure surrounds and is spaced apart from the encapsulating layer. The lid structure includes a first opening that is covered by the first surface of the package substrate. The first electronic component is over the first surface of the package substrate and arranged within the first opening of the lid structure. The heat sink covers the lid structure and the semiconductor die.

Another exemplary embodiment of a semiconductor package structure includes a package substrate, at least one semiconductor die, a lid structure, a first electronic component and a heat sink. The package substrate has a first surface and a second surface opposite to the first surface. The semiconductor die is on the first surface of the package substrate and surrounded by an encapsulating layer. The lid structure surrounds the encapsulating layer and caps a top surface of the semiconductor die. The lid structure includes a first opening that is covered by the first surface of the package substrate. The first electronic component is over the first surface of the package substrate and arranged within the first opening of the lid structure. The heat sink covers the lid structure, so that a portion of the lid structure is between the heat sink and the semiconductor die.

Yet another exemplary embodiment of a semiconductor package structure includes a package substrate, at least one semiconductor die, a lid structure, a first electronic component and a heat sink. The package substrate has a first surface and a second surface opposite to the first surface. The semiconductor die is on the first surface of the package substrate and surrounded by an encapsulating layer. The lid structure surrounds and is spaced apart from the encapsulating layer. The lid structure includes a first recess that is inwardly curved from an inner sidewall of the lid structure to form a first eave portion. The first electronic component is over the first surface of the package substrate and covered by the first eave portion of the lid structure. The heat sink covers the lid structure and the semiconductor die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
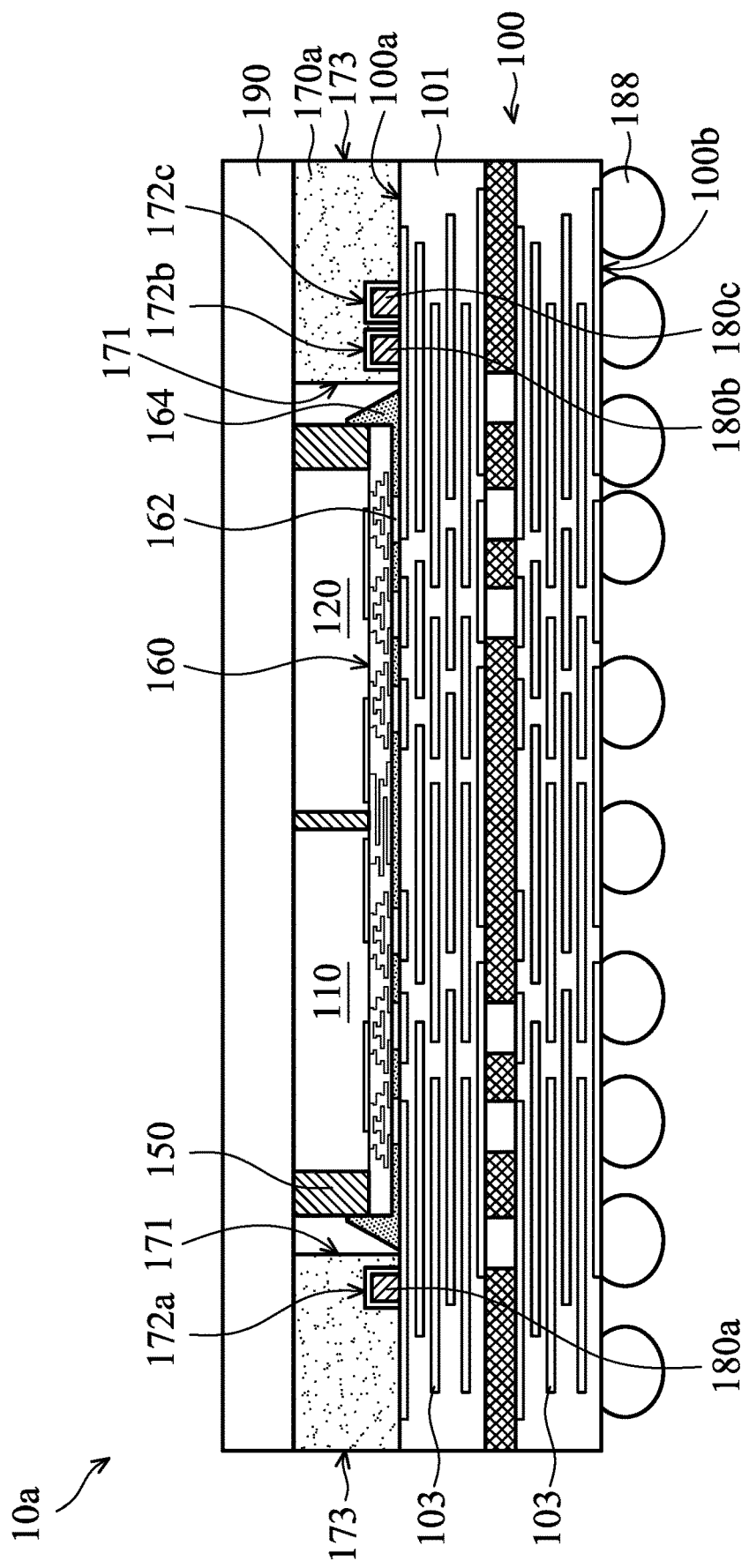
FIG. 1 is a cross-sectional view of an exemplary semiconductor package structure with a ring-type lid structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 2A:
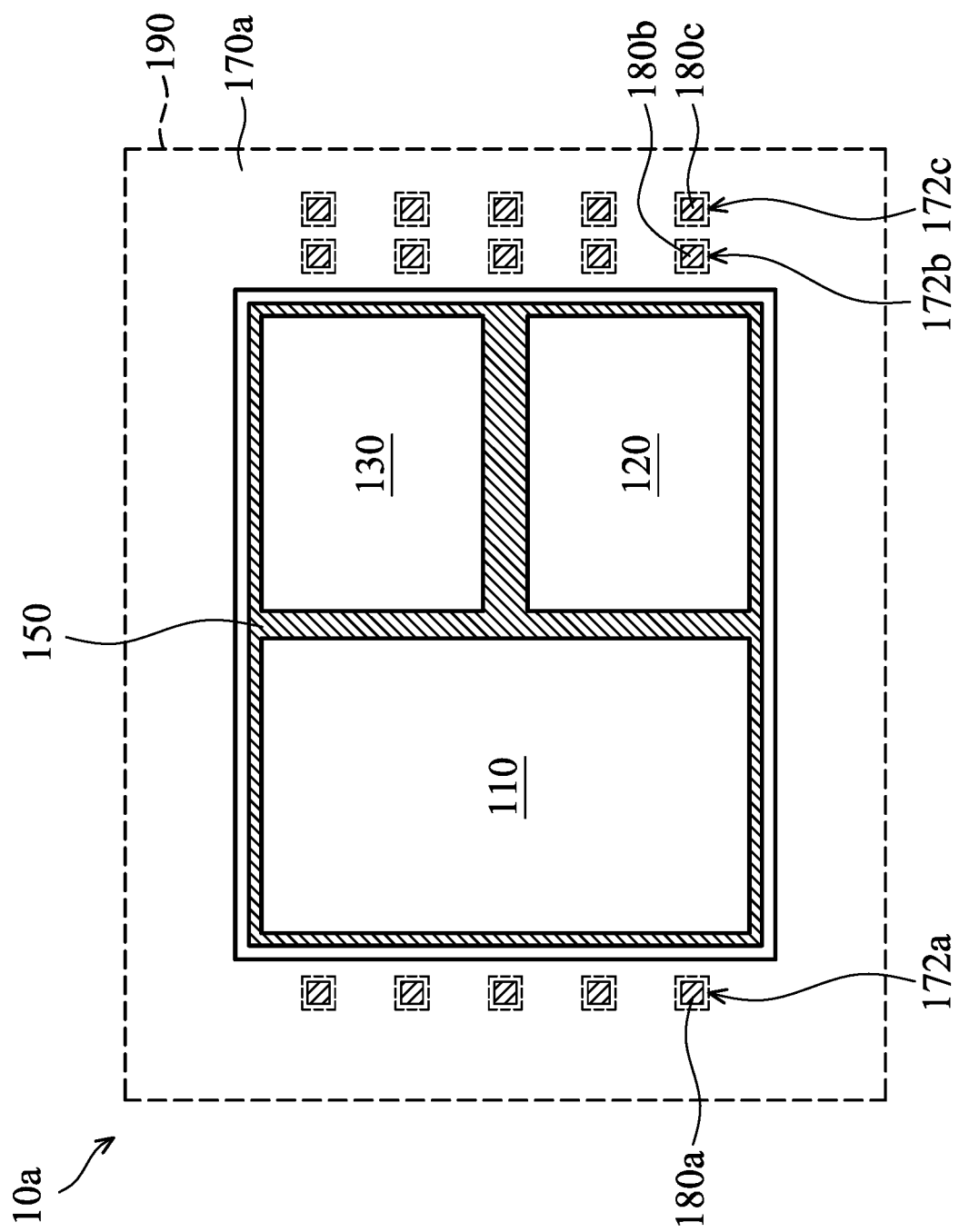
FIG. 2A is a plan view of a semiconductor package structure and shows the shape of the openings in the ring-type lid structure of the semiconductor package structure in accordance with some embodiments.
Figure 2B:
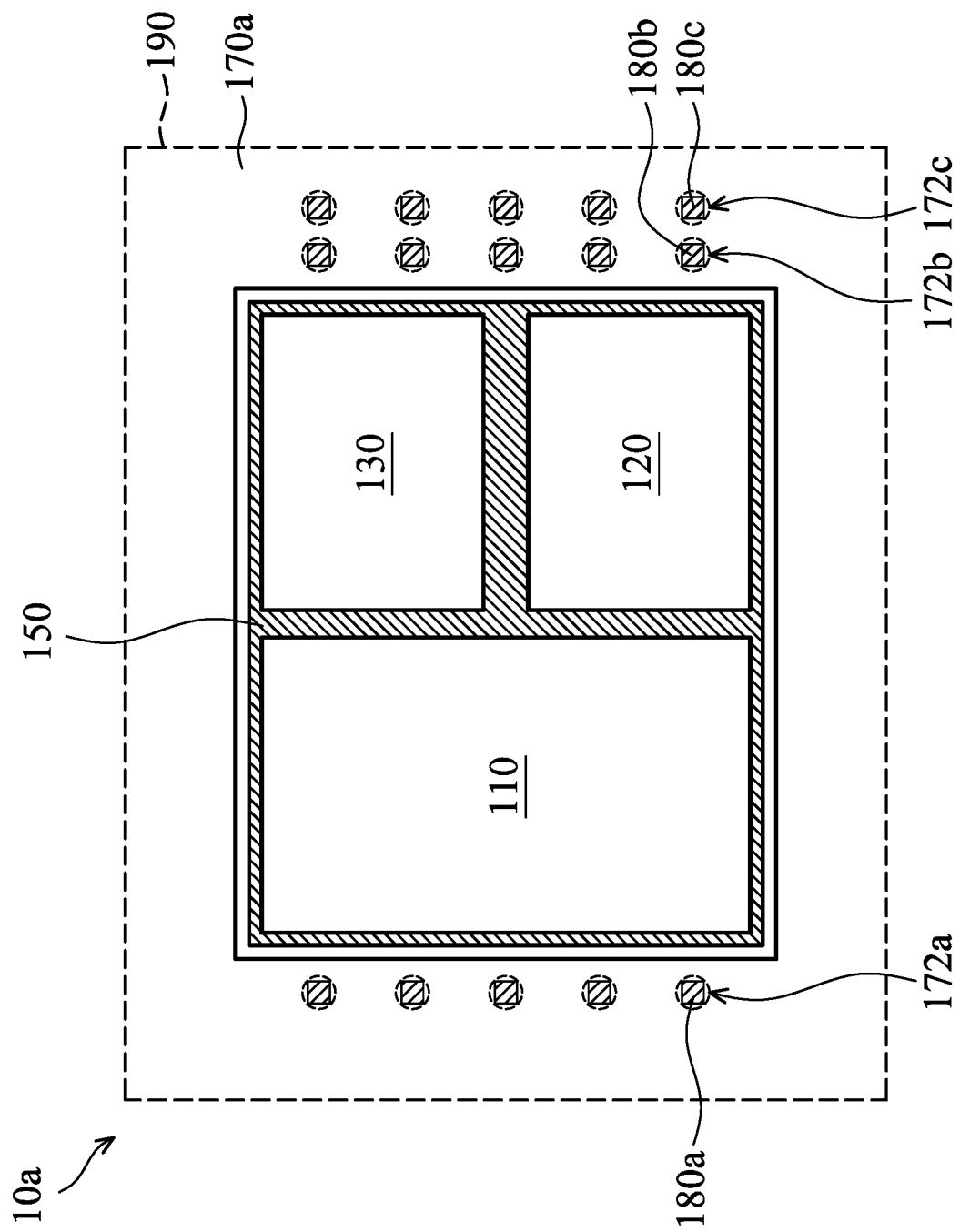
FIG. 2B is a plan view of a semiconductor package structure and shows the shape of the openings in the ring-type lid structure of the semiconductor package structure in accordance with some embodiments.

FIG. 1 is a cross-sectional view of an exemplary semiconductor package structure 10a with a ring-type lid structure in accordance with some embodiments. FIGS. 2A and 2B are plan views of a semiconductor package structure 10a and respectively show the shape of the openings in the ring-type lid structure of the semiconductor package structure 10a in accordance with some embodiments. In some embodiments, the semiconductor package structure 10a is a wafer-level semiconductor package structure, for example, a flip-chip semiconductor package structure.

As shown in FIG. 1, the semiconductor package structure 10a includes a system-on-chip (SOC) package structure in accordance with some embodiments. As shown in FIG. 1, the semiconductor package structure 10a includes a package substrate 100 having a first surface 100a and a second surface 100b opposite to the first surface 100a. The second surface 100b of the package substrate 100 in the semiconductor package structure 10a is mounted on a base (not shown). In some embodiments, the base includes a printed circuit board (PCB) and may be formed of polypropylene (PP). In some embodiments, the semiconductor package structure 10a is mounted on the base by a bonding process. In some embodiments, the semiconductor package structure 10a includes conductive structures 188 (such as solder bump structures) disposed on the second surface 100b of the package substrate 100. The conductive structures 188 are employed to be mounted on and electrically coupled to the base by the bonding process. In some other embodiments, the conductive structures 188 include copper bumps, conductive pillar structures, conductive wire structures, or conductive paste structures.

In some embodiments, the package substrate 100 includes redistribution layer (RDL) structures (also referred to as fan-out structures) therein. In some embodiments, the package substrate 100 includes an insulating layer 101 and one or more patterned conductive layers 103 serving as conductive traces and disposed in the insulating layer 101. For example, patterned conductive layers 103 are disposed at various levels of the insulating layer 101.

In some embodiments, those patterned conductive layers 103 are formed of metal. In some embodiments, the insulating layer 101 includes sub-dielectric layers (not shown) successively stacked from the second surface 100b of the package substrate 100 toward the first surface 100a of the package substrate 100. In some embodiments, the insulating layer 101 may be formed of organic materials, which include a polymer base material, non-organic materials, which include silicon nitride (SiNx), silicon oxide (SiOx), or the like. For example, those sub-dielectric layers are made of a polymer base material. In some embodiments, the insulating layer 101 is a high-k dielectric layer (k is the dielectric constant of the dielectric layer). It should be noted that the number of patterned conductive layers 103 and the number of sub-dielectric layers of the package substrate 100 shown in FIG. 1 is only an example and is not a limitation to the present invention.

In some embodiments, the patterned conductive layer 103 that is in the uppermost layer-level of the insulating layer 101 is adjacent to the first surface 100a, so that this patterned conductive layer 103 has a top surface that is substantially level with the first surface 100a.

As shown in FIG. 1, the semiconductor package structure 10a further includes one or more semiconductor devices mounted onto the first surface 100a of the package substrate 100 in accordance with some embodiments. In some embodiments, the semiconductor devices may include semiconductor dies 110, 120, and 130 (in which the semiconductor die 130 is not shown in FIG. 1 and is shown in FIGS. 2A and 2B) that are disposed on the first surface 100a of the package substrate 100.

The semiconductor dies 110, 120, and 130 may include a microcontroller (MCU), a microprocessor (VIPU), a random access memory (RAM), a power management integrated circuit (PMIC), a flash memory, a global positioning system (GPS) device, or a radio frequency (RF) device or any combination thereof. In some embodiments, at least one of the semiconductor dies 110, 120, and 130 is a SOC die. For example, the semiconductor dies 110, 120, and 130 are SOC dies. Alternatively, one of the semiconductor dies 110, 120, and 130 is a memory die or a base-band die. It should be noted that the arrangement of semiconductor dies are not limited to the disclosed embodiments. Moreover, it should be also noted that the number of semiconductor dies integrated in the semiconductor package structure 10*a* is not limited to that disclosed in the embodiments.

In some embodiments, the semiconductor dies 110, 120, and 130 are electrically coupled to the conductive structures 188 through package substrate 100. In some embodiments, the semiconductor dies 110, 120, and 130 are fabricated by flip-chip technology. The semiconductor dies 110, 120, and 130 respectively include pads to be in contact with an RDL structure 160. The RDL structure 160 is interposed between the package substrate 100 and the semiconductor dies 110, 120, and 130. The RDL structure 160 having the semiconductor dies 110, 120, and 130 thereon is mounted onto the uppermost patterned conductive layer 103 of the package substrate 100 via conductive structures 162, respectively.

In some embodiments, the conductive structures 162 include solder bump structures. In some other embodiments, the conductive structures 162 include copper bumps, conductive pillar structures, conductive wire structures, or conductive paste structures. In some embodiments, an optional underfill material 164 fills the gaps between the conductive structures 162 and surrounds the RDL structure 160 and the semiconductor dies 110, 120, and 130 on the RDL structure 160.

As shown in FIG. 1 and FIG. 2A or 2B, the semiconductor package structure 10*a* further includes one or more first electronic components 180*a*, one or more second electronic components 180*b*, and one or more third electronic components 180*c* that are mounted onto the first surface 100*a* of the package substrate 100. In some embodiments, the first electronic components 180*a*, the second electronic components 180*b*, and the third electronic components 180*c* are electrically coupled to the semiconductor dies 110, 120, and 130 through the conductive traces (i.e., patterned conductive layers 103) of the package substrate 100.

As shown in FIG. 2A or 2B, the first electronic components 180*a* are substantially arranged in a line and are adjacent to the semiconductor die 110, in accordance with some embodiments. Similarly, the second electronic components 180*b* and the third electronic components 180*c* are adjacent to the semiconductor dies 120 and 130 and are substantially arranged side by side and in lines. It should be noted that those arrangements and the number of electronic components in the semiconductor package structure 10*a* are not limited to those disclosed in the embodiments. The first electronic components 180*a*, the second electronic components 180*b*, and the third electronic components 180*c* are spaced apart from the optional underfill material 164.

In some embodiments, the first electronic components 180*a*, the second electronic components 180*b*, and the third electronic components 180*c* includes passive devices. For example, the passive devices may include capacitors, inductors, resistors, or a combination thereof. Moreover, the passive devices includes at least one electrode (not shown) electrically coupled to the uppermost patterned conductive layer 103 of the package substrate 100.

As shown in FIG. 1, the semiconductor package structure 10*a* further includes an encapsulating layer 150 that covers a portion of the RDL structure 160 and surrounds the semiconductor dies 110, 120, and 130. In some embodiments, the optional underfill material 164 extends onto the sidewall of the encapsulating layer 150, so as to surround the encapsulating layer 150. In some embodiments, the encapsulating layer 150 may be formed of a molding compound layer. For example, the molding compound layer may be formed of an epoxy, a resin, a moldable polymer, or the like. The molding compound layer may be applied while substantially liquid, and then may be cured through a chemical reaction, such as in an epoxy or resin. In some other embodiments, the molding compound layer may be an ultraviolet (UV) or thermally cured polymer applied as a gel or malleable solid capable of being disposed around the semiconductor dies 110, 120 and 130, and then may be cured through a UV or thermal curing process. The molding compound layer may be cured with a mold (not shown).

As shown in FIG. 1, the semiconductor package structure 10 further includes a lid structure 170*a* disposed on the first surface 100*a* of the package substrate 100. In some embodiments, the lid structure 170*a* has a ring shaped and therefore it is also referred to as a ring-type lid structure. The ring-type lid structure 170*a* surrounds the encapsulating layer 150 and the underfill material 164, so that the semiconductor dies 110, 120 and 130 are exposed from the ring-type lid structure 170*a*. The ring-type lid structure 170*a* is also spaced apart from the encapsulating layer 150 and the underfill material 164.

In some embodiments, the ring-type lid structure 170*a* includes openings 172*a*, 172*b*, and 172*c* that are covered by the first surface 100*a* of the package substrate 100, as shown in FIGS. 1 and 2A or 2B. Those openings 172*a*, 172*b*, and 172*c* respectively correspond to the first electronic components 180*a*, the second electronic components 180*b* and the third electronic components 180*c*. As shown in FIG. 2A or 2B, in some embodiments, each of the first electronic components 180*a* is arranged within each of the openings 172*a*. Similarly, each of the second electronic components 180*b* is arranged within each of the openings 172*b* and each of the third electronic components 180*c* is arranged within each of the openings 172*c*, so that the number of the openings (e.g., openings 172*a*, 172*b* and 172*c*) formed in the ring-type lid structure 170*a* is equal to the number of the electronic components (e.g., the electronic components 180*a*, 180*b* and 180*c*) disposed on the first surface 100*a* of the package substrate.

Since the first electronic components 180*a*, the second electronic components 180*b* and the third electronic components 180*c* are respectively arranged within the openings 172*a*, 172*b* and 172*c* of the ring-type lid structure 170*a*, the inner sidewall of the ring-type lid structure 170*a* can be close to the optional underfill material 164 or the encapsulating layer 150, so as to greatly increase the minimum distance from the inner sidewall 171 of the lid structure 170*a* to the outer sidewall 173 of the lid structure 170*a* (i.e., the width of the ring-type lid structure 170*a*). As a result, the structural strength of the ring-type lid structure 170*a* can be enhanced, thereby preventing package warpage during fabrication of the semiconductor package structure 10*a*.

In some embodiments, the openings 172*a*, 172*b* and 172*c* of the ring-type lid structure 170*a* have a rectangular shape as viewed from a top-view perspective, as shown in FIG. 2A. In some embodiments, the openings 172*a*, 172*b* and 172*c* of the ring-type lid structure 170*a* have a circular shape as viewed from a top-view perspective, as shown in FIG. 2B. The circular openings 172*a*, 172*b* and 172*c* can reduce stress concentration. Moreover, the circular openings 172*a*, 172*b* and 172*c* can be fabricated easily. For example, the circular openings 172*a*, 172*b* and 172*c* can be formed by a laser drilling process.

As shown in FIG. 1, the semiconductor package structure 10*a* further includes a heat sink 190 covers the ring-type lid structure 170*a* and the semiconductor dies 110, 120 and 130.

Since the semiconductor dies 110, 120 and 130 are exposed from the ring-type lid structure 170a, the heat sink 190 can be in direct contact with those semiconductor dies 110, 120 and 130, thereby improving the thermal dissipation properties. In some other embodiments, a thermal interface material (TIM) layer (not shown) is disposed between the bottom surface of the heat sink 190 and the top surfaces of the semiconductor dies 110, 120 and 130.

Figure 3:
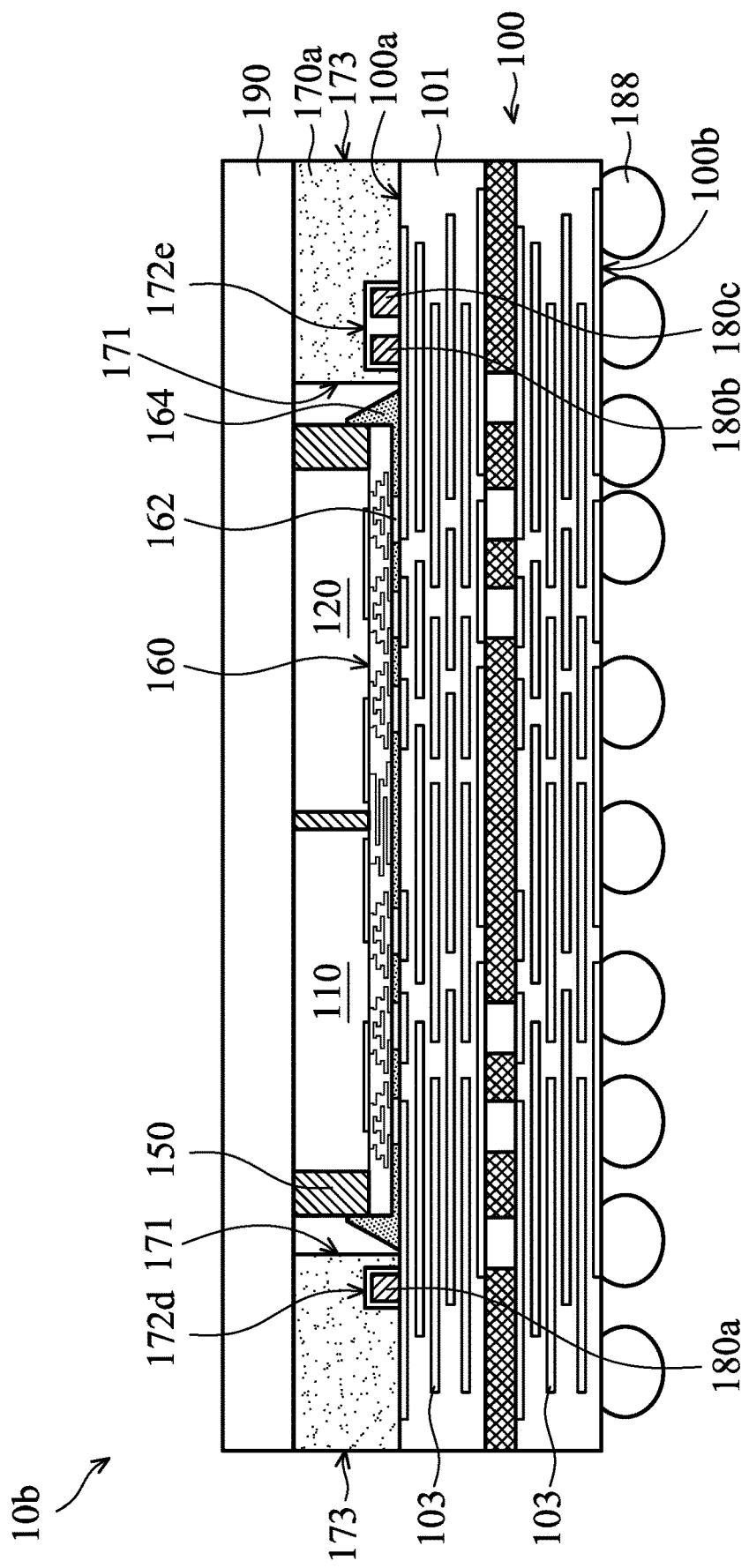
FIG. 3 is a cross-sectional view of an exemplary semiconductor package structure with a ring-type lid structure in accordance with some embodiments.
Figure 4A:
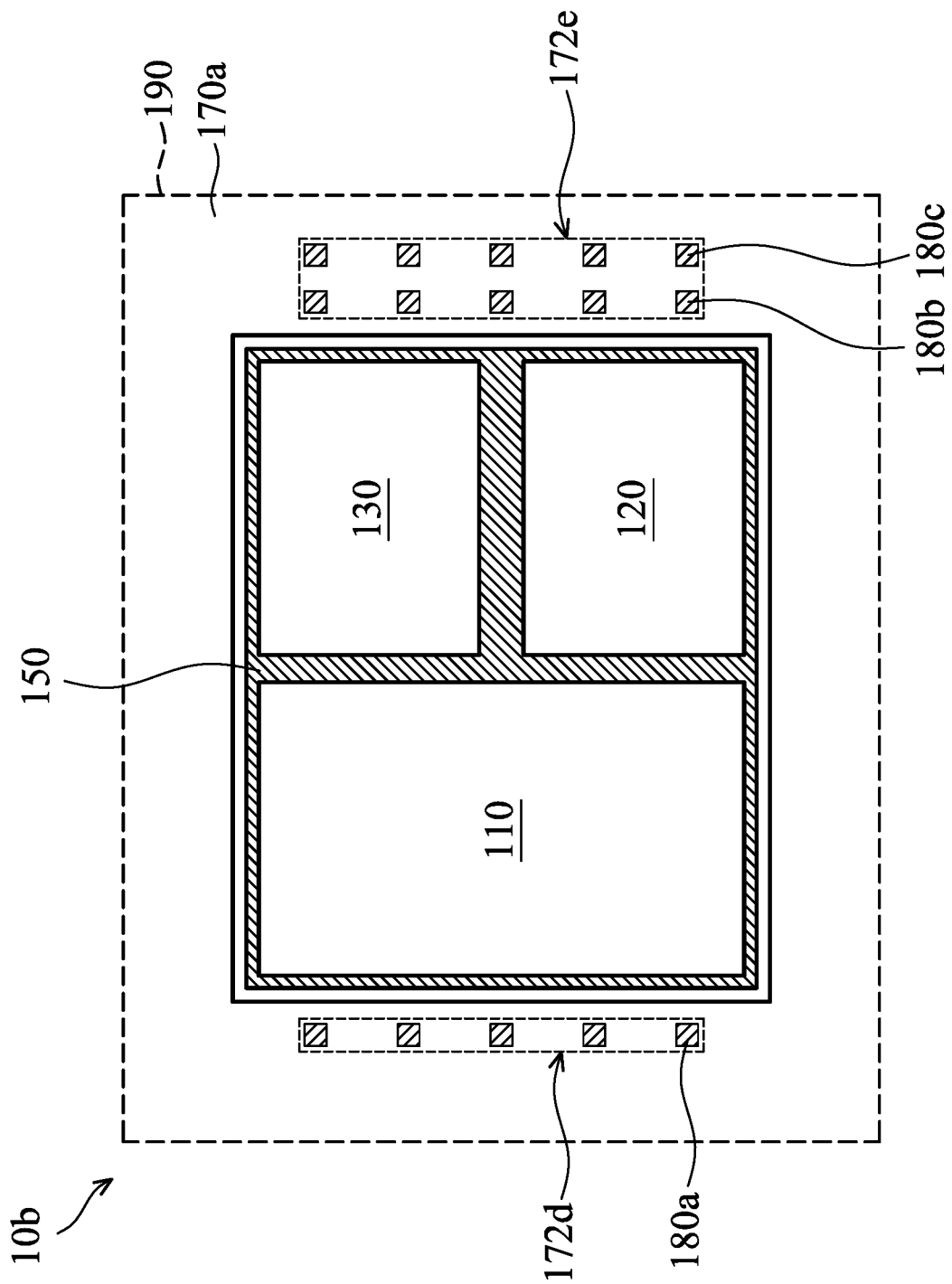
FIG. 4A is a plan view of a semiconductor package structure and shows the arrangement of the openings in the ring-type lid structure of the semiconductor package structure in accordance with some embodiments.
Figure 4B:
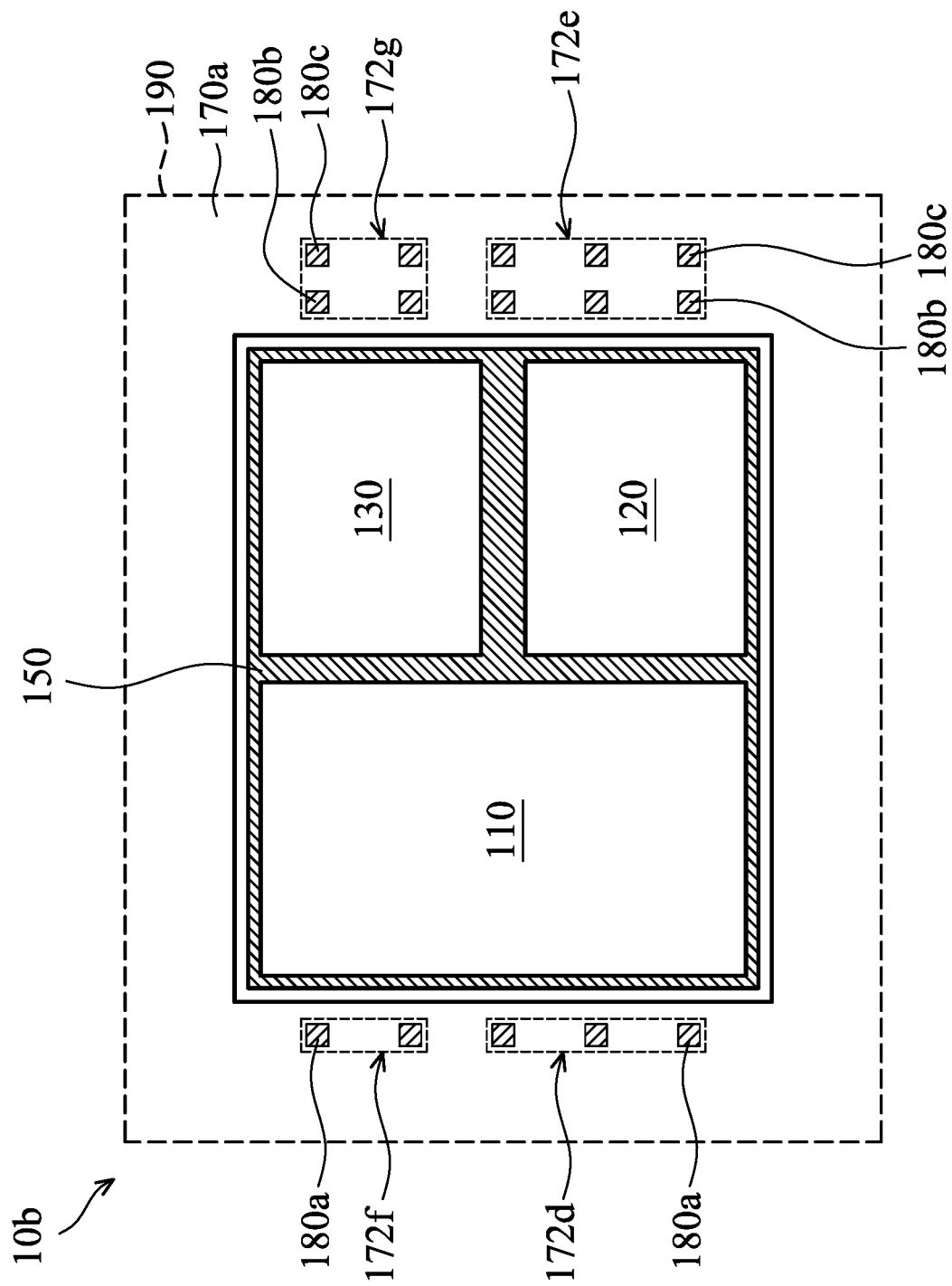
FIG. 4B is a plan view of a semiconductor package structure and shows the arrangement of the openings in the ring-type lid structure of the semiconductor package structure in accordance with some embodiments.
Figure 4C:
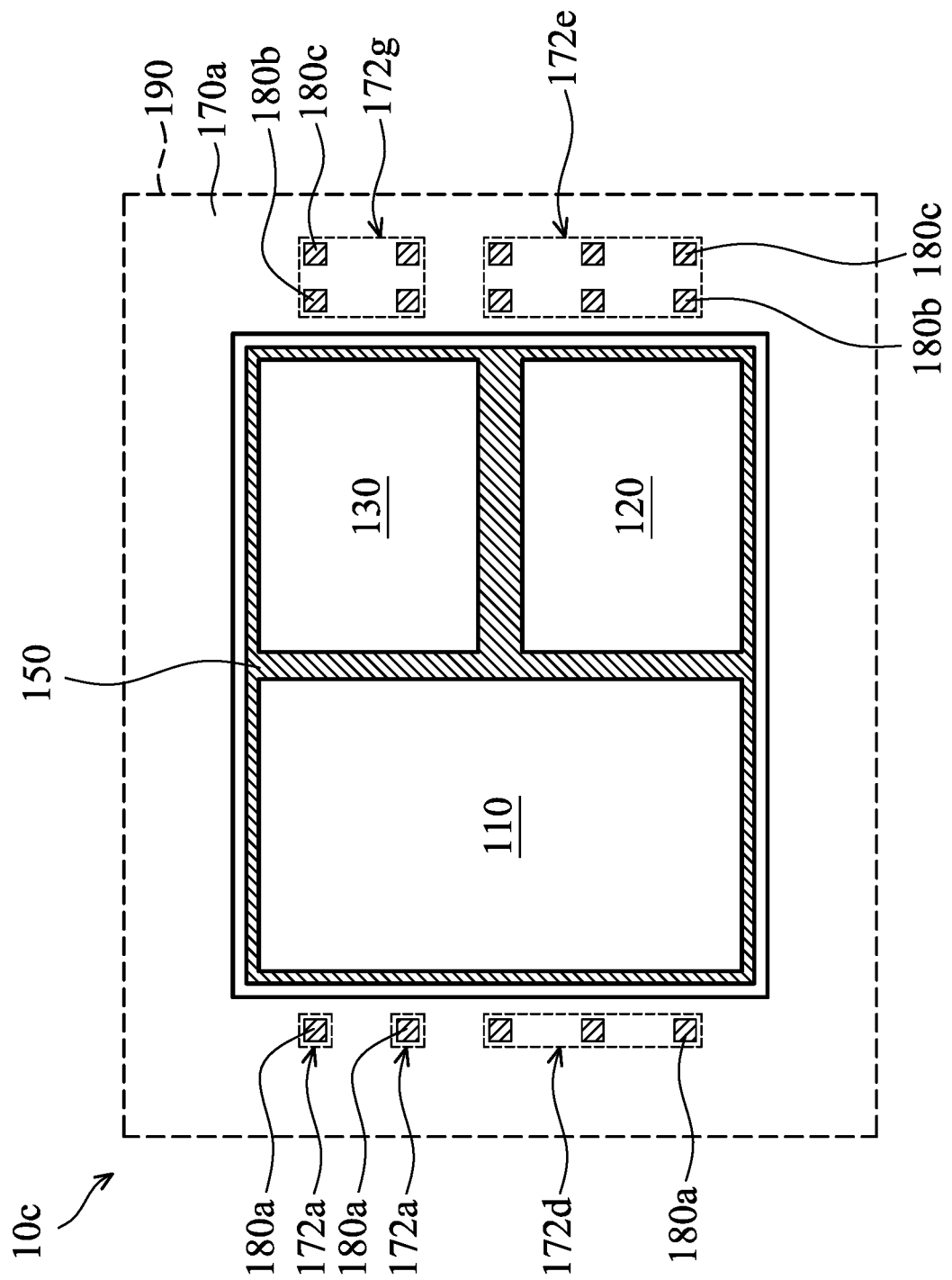
FIG. 4C is a plan view of a semiconductor package structure and shows the arrangement of the openings in the ring-type lid structure of the semiconductor package structure in accordance with some embodiments.

FIG. 3 is a cross-sectional view of an exemplary semiconductor package structure 10b with a ring-type lid structure in accordance with some embodiments. FIGS. 4A, 4B and 4C are plan views of a semiconductor package structure 10b and show the arrangement of the openings in the ring-type lid structure of the semiconductor package structure 10a in accordance with some embodiments. Descriptions of elements of the embodiments hereinafter that are the same as or similar to those previously described with reference to FIGS. 1, 2A and 2B are omitted for brevity. The semiconductor package structure 10b is similar to the semiconductor package structure 10a shown in FIG. 1. Unlike the semiconductor package structure 10a shown in FIG. 1, the ring-type lid structure 170a includes openings 172d and 172e having different areas from each other as viewed from a top-view perspective, as shown in FIGS. 3 and 4A. In those cases, the area of the opening 172e as viewed from a top-view perspective may be greater than the area of the opening 172d as viewed from a top-view perspective. Moreover, there is more than one first electronic component 180a arranged within the opening 172d and there are also more than one second electronic component 180b and more than one third electronic component 180c arranged within the opening 172e. For example, there are five first electronic components 180a arranged within the opening 172d and there are five second electronic components 180b and five third electronic components 180c arranged within the opening 172e, as shown in FIG. 4A.

In some other embodiments, the ring-type lid structure 170a includes more than two openings and these openings also have different area from each other as viewed from a top-view perspective. For an example, as shown in FIGS. 3 and 4B, the ring-type lid structure 170a includes openings 172d, 172e, 172f and 172g (in which the openings 172f and 172g are not shown in FIG. 3 and are shown in FIG. 4B) having different areas from each other as viewed from a top-view perspective. Moreover, there is more than one electronic component arranged within the opening 172d, 172e, 172f or 172g. There are three first electronic components 180a arranged within the opening 172d and there are two first electronic components 180a arranged within the opening 172f. Similarly, there are three second electronic components 180b and three third electronic components 180c arranged within the opening 172e and there are two second electronic components 180b and two third electronic components 180c arranged within the opening 172g.

For another example, as shown in FIGS. 3 and 4C, the ring-type lid structure 170a includes openings 172a, 172d, 172e and 172g (in which the openings 172a and 172g are not shown in FIG. 3 and are shown in FIG. 4C) having different areas from each other as viewed from a top-view perspective. There is a first electronic component 180a arranged within the opening 172a and there are three first electronic components 180a arranged within the opening 172d. Similarly, there are three second electronic components 180b and three third electronic components 180c arranged within the opening 172e and there are two second electronic components 180b and two third electronic components 180c arranged within the opening 172g.

In the semiconductor package structure 10b, the openings with the greater area can be used to place more than one electronic component therein, so that the number of the openings formed in the lid structure 170a can be reduced, thereby reducing the manufacturing cost. Moreover, since the area and the number of the openings in the lid structure 170a can be modified according to the arrangement and the number of the electronic components, the design flexibility of the lid structure 170a can be increased.

Since the semiconductor package structure 10b has a similar structure to the semiconductor package structure 10a, the semiconductor package structure 10b has substantially the same advantages as semiconductor package structure 10a.

Figure 5A:
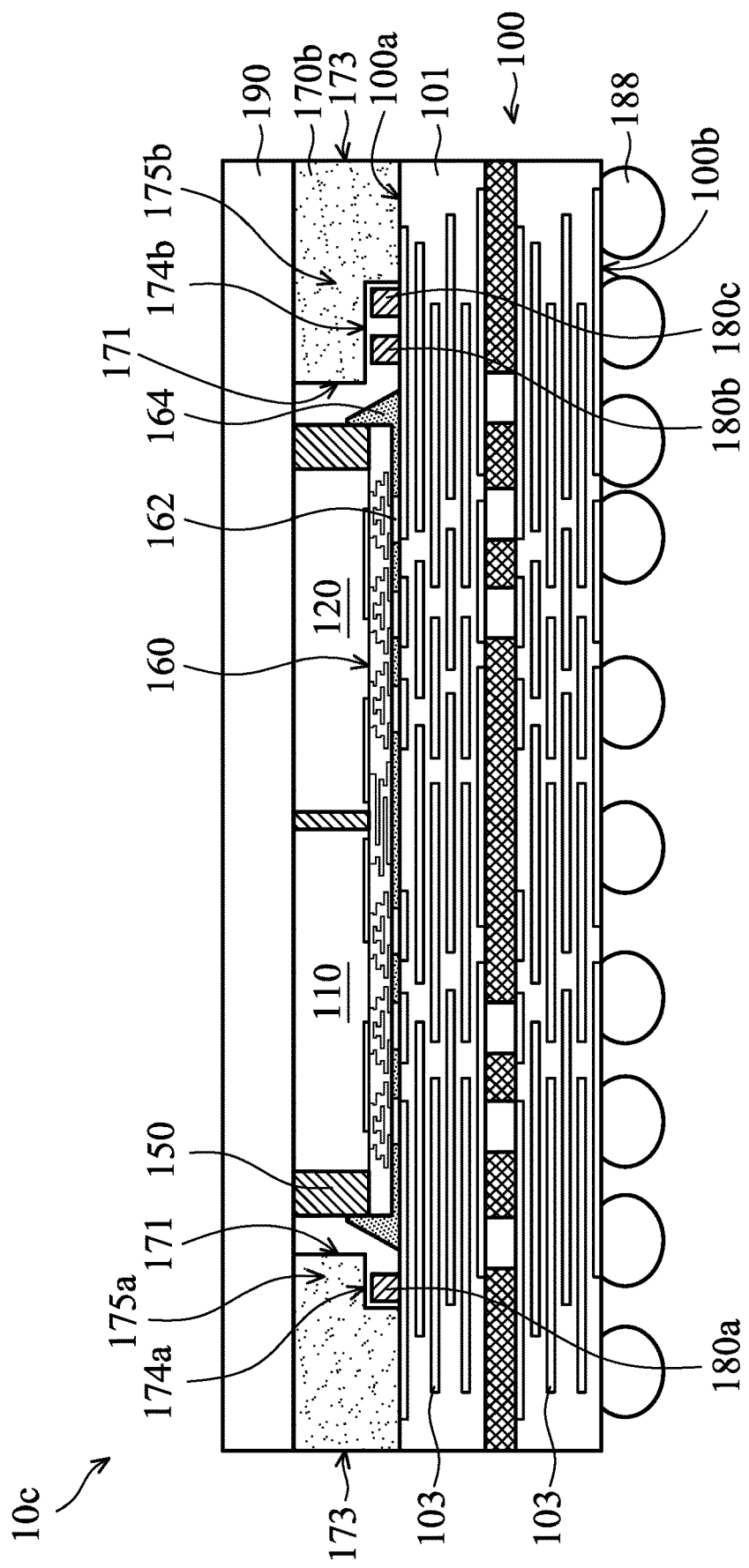
FIG. 5A is a cross-sectional view of an exemplary semiconductor package structure with a ring-type lid structure in accordance with some embodiments.

FIG. 5A is a cross-sectional view of an exemplary semiconductor package structure 10c with a ring-type lid structure in accordance with some embodiments. Descriptions of elements of the embodiments hereinafter that are the same as or similar to those previously described with reference to FIG. 1 or 3 are omitted for brevity. The semiconductor package structure 10c is similar to the semiconductor package structure 10a shown in FIG. 1 or the semiconductor package structure 10b shown in FIG. 3. Unlike the semiconductor package structures 10a and 10b shown in FIGS. 1 and 3, respectively, the ring-type lid structure 170b in the semiconductor package structure 10c includes one or more recesses that are inwardly curved from the inner sidewall 171 of the lid structure 170b to form eave portions.

As shown in FIG. 5A, the ring-type lid structure 170b in the semiconductor package structure 10c includes one or more recesses 174a that is inwardly curved from an inner sidewall 171 of the lid structure 170b to form one or more corresponding eave portion 175a adjacent to the semiconductor die 110 and one or more recesses 174b that is inwardly curved from an inner sidewall 171 of the lid structure 170b to form one or more corresponding eave portion 175b adjacent to the semiconductor die 120. To simplify the diagram, only two recesses 174a and 174b, and two eave portion 175a and 175b are depicted. In some embodiments, one or more first electronic components 180a are arranged within the recess 174a, so that the eave portion 175a is formed above and covers the one or more first electronic components 180a. Similarly, one or more second electronic components 180b are arranged within the recess 174b, so that the eave portion 175b is formed above and covers the one or more second electronic components 180b. Also, one or more third electronic components 180c are also arranged within the recess 174b, so that the eave portion 175b also covers the one or more third electronic components 180c. It should be noted that the areas of the recesses formed in the ring-type lid structure 170b can be equal to or different from each other. For example, the area of the recess 174b is greater than that of the recess 174a. Moreover, the areas, the arrangement and the number of the recesses formed in ring-type lid structure 170b can be modified according to the design demands. In some embodiments, the areas, the arrangement and the number of the recesses formed in ring-type lid structure 170b are the same or similar to those of the openings formed in ring-type lid structure 170a shown in FIGS. 4A, 4B and 4C. In some other embodiments, an outer sidewall (not shown) may be extendedly formed from the eave portion 175b but not contacted with the first surface 100a of the package substrate 100 as to provide a higher structural strength for further preventing package warpage during fabrication of the semiconductor package structure 10c.

In the semiconductor package structure 10c, the recesses with the greater area can be used to place more than one electronic component therein, so that the number of the recesses formed in the lid structure 170a can be reduced, thereby reducing the manufacturing cost. Moreover, since the area and the number of the recesses in the lid structure 170a can be modified according to the arrangement and the number of the electronic components, the design flexibility of the lid structure 170b can be increased. In addition, since the fabrication of the recess is easier than that of the opening, the process for fabrication of the lid structure can be further simplified.

Since the semiconductor package structure 10c has a similar structure to the semiconductor package structure 10a, the semiconductor package structure 10c has substantially the same advantages as semiconductor package structure 10a.

Figure 5B:
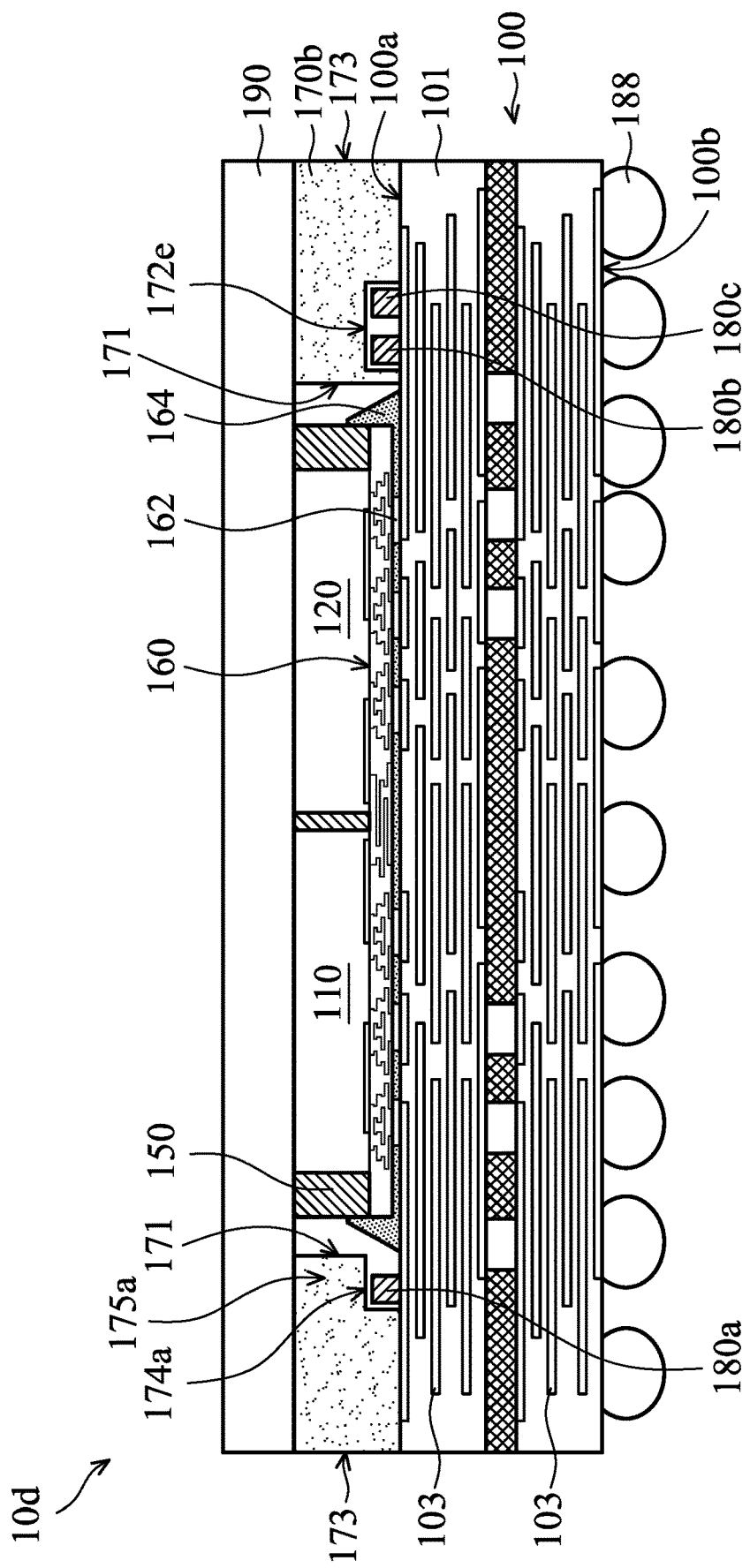
FIG. 5B is a cross-sectional view of an exemplary semiconductor package structure with a ring-type lid structure in accordance with some embodiments.

FIG. 5B is a cross-sectional view of an exemplary semiconductor package structure 10d with a ring-type lid structure in accordance with some embodiments. Descriptions of elements of the embodiments hereinafter that are the same as or similar to those previously described with reference to FIG. 3 or 5A are omitted for brevity. The semiconductor package structure 10d is similar to the semiconductor package structure 10b shown in FIG. 3 or the semiconductor package structure 10c shown in FIG. 5A. Unlike the semiconductor package structures 10b and 10c shown in FIG. 3 and FIG. 5A, the ring-type lid structure 170b in the semiconductor package structure 10d includes one or more recesses and one or more openings.

As shown in FIG. 5B, the ring-type lid structure 170b in the semiconductor package structure 10d includes one or more recesses 174a that is inwardly curved from an inner sidewall 171 of the lid structure 170b to form one or more corresponding eave portion 175a adjacent to the semiconductor die 110 and one or more openings 172e adjacent to the semiconductor die 120. To simplify the diagram, only a recess 174a and an opening 172e are depicted. In some embodiments, one or more first electronic components 180a having similar arrangement as shown in FIG. 5A are arranged within the recess 174a, so that the eave portion 175a is formed above and covers the one or more first electronic components 180a. Furthermore, one or more second electronic components 180b and one or more third electronic components 180c are arranged within the opening 172e. In some other embodiments, an outer sidewall (not shown) may be extendedly formed from the eave portion 175a but not contacted with the first surface 100a of the package substrate 100 as to provide package warpage prevention as mentioned above.

Figure 5C:
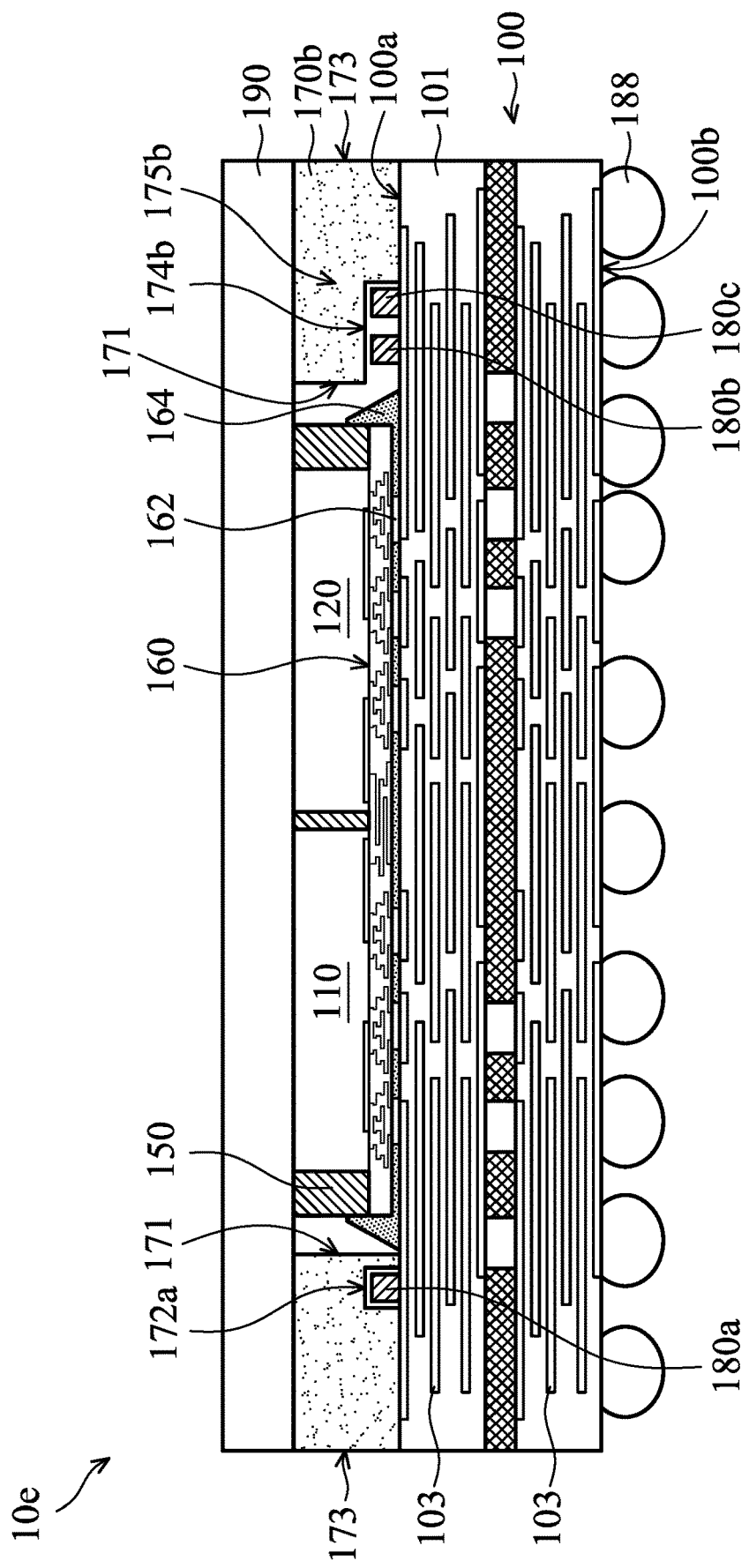
FIG. 5C is a cross-sectional view of an exemplary semiconductor package structure with a ring-type lid structure in accordance with some embodiments.

FIG. 5C is a cross-sectional view of an exemplary semiconductor package structure 10e with a ring-type lid structure in accordance with some embodiments. Descriptions of elements of the embodiments hereinafter that are the same as or similar to those previously described with reference to FIG. 3 or 5A are omitted for brevity. The semiconductor package structure 10e is similar to the semiconductor package structure 10b shown in FIG. 3 or the semiconductor package structure 10c shown in FIG. 5A. Unlike the semiconductor package structures 10b and 10c shown in FIGS. 3 and 5A, respectively, the ring-type lid structure 170b in the semiconductor package structure 10e includes one or more recesses and one or more openings.

As shown in FIG. 5C, the ring-type lid structure 170b in the semiconductor package structure 10e includes one or more openings 172a adjacent to the semiconductor die 110 and one or more recesses 174b that is inwardly curved from an inner sidewall 171 of the lid structure 170b to form one or more corresponding eave portion 175b adjacent to the semiconductor die 120. To simplify the diagram, only an opening 172a and a recess 174b are depicted. In some embodiments, one or more first electronic components 180a are arranged within the opening 172a. Furthermore, one or more second electronic components 180b and one or more third electronic components 180c are arranged within the recess 174b, so that the eave portion 175b is formed above and covers the one or more second electronic components 180b and the third electronic component 180c. It should be noted that the areas of the recesses and openings formed in the ring-type lid structure 170b shown in FIG. 5B or 5C can be equal to or different from each other. For example, the area of the recess 174a is less than that of the opening 172e, as shown in FIG. 5B. Moreover, the area of the recess 174b is greater than that of the opening 172a, as shown in FIG. 5C. Also, the areas, the arrangement and the number of the recesses and openings formed in ring-type lid structure 170b can be modified according to the design demands. In some other embodiments, an outer sidewall (not shown) may be extendedly formed from the eave portion 175a but not contacted with the first surface 100a of the package substrate 100 as to provide package warpage prevention as mentioned above.

In some embodiments, the areas, the arrangement and the number of the recesses and openings formed in ring-type lid structure 170b in the semiconductor package structures 10d and 10e are the same or similar to those of the openings formed in ring-type lid structure 170a shown in FIGS. 4A, 4B and 4C.

In the semiconductor package structure 10d or 10e, the recesses or openings with the greater area can be used to place more than one electronic component therein, so that the number of the recesses and/or the openings formed in the lid structure 170b can be reduced, thereby reducing the manufacturing cost. Moreover, since the area and the number of the recesses and/or the openings in the lid structure 170b can be modified according to the arrangement and the number of the electronic components, the design flexibility of the lid structure 170b can be increased.

Since the semiconductor package structures 10d and 10e have a similar structure to the semiconductor package structure 10a, the semiconductor package structures 10d and 10e also have advantages that are the same as or similar to those of the semiconductor package structure 10a.

Figure 6A:
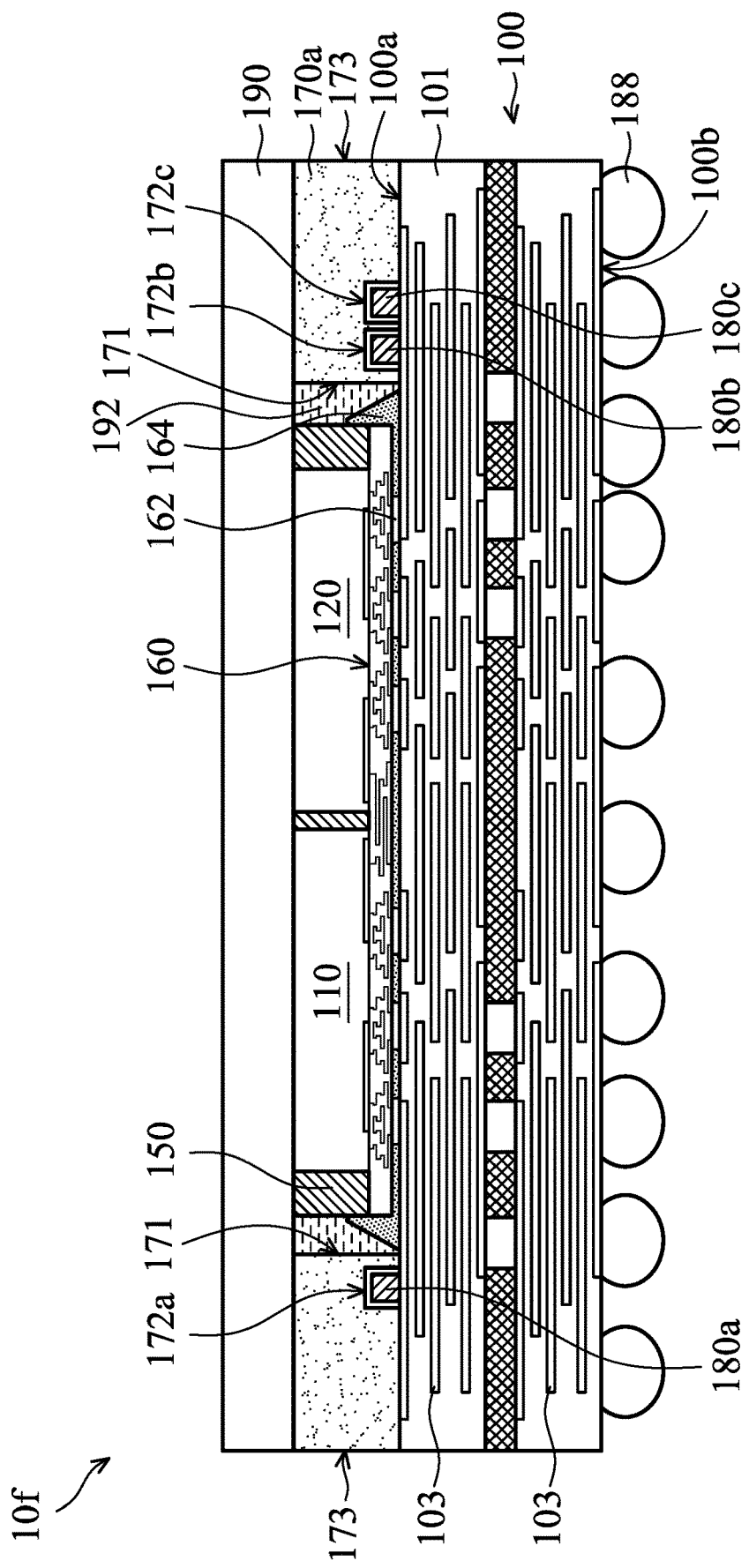
FIG. 6A is a cross-sectional view of an exemplary semiconductor package structure with a ring-type lid structure in accordance with some embodiments.

FIG. 6A is a cross-sectional view of an exemplary semiconductor package structure 10f with a ring-type lid structure in accordance with some embodiments. Descriptions of elements of the embodiments hereinafter that are the same as or similar to those previously described with reference to FIG. 1 are omitted for brevity. The semiconductor package structure 10f is similar to the semiconductor package structure 10a shown in FIG. 1. Compared to the semiconductor package structure 10a shown in FIG. 1, the semiconductor package structure 10f further includes a cooling material 192 disposed between and in direct contact with the encapsulating layer 150 and the lid structure 170a.

In some embodiments, the cooling material 192 is also in direct contact with the heat sink 190 and the optional underfill material 164. The cooling material 192 may provide a thermal path for further improving the thermal dissipation properties of the semiconductor dies 110 and 120. The cooling material 192 may also serve as a buffer layer to reduce the stress generated during the fabrication of the semiconductor package structure 10f.

In some embodiments, the cooling material 192 is formed of a material that is the same or similar to that of the underfill material 164 or the encapsulating layer 150. In some embodiments, the cooling material 192 is formed of TIM, molding compound, underfill material or another suitable cooling material. In some other embodiments, the cooling material 192 may be made of silicones, which are polymers including, but not limited to, silicon, carbon, hydrogen, oxygen or other elements. The cooling material 192 may comprise conductive materials, such as alumina ($Al_2O_3$) or zinc oxide ($ZnO_2$) mixed with silicone.

Since the semiconductor package structure 10f has a similar structure to the semiconductor package structure 10a, the semiconductor package structure 10f has substantially the same advantages as semiconductor package structure 10a.

Figure 6B:
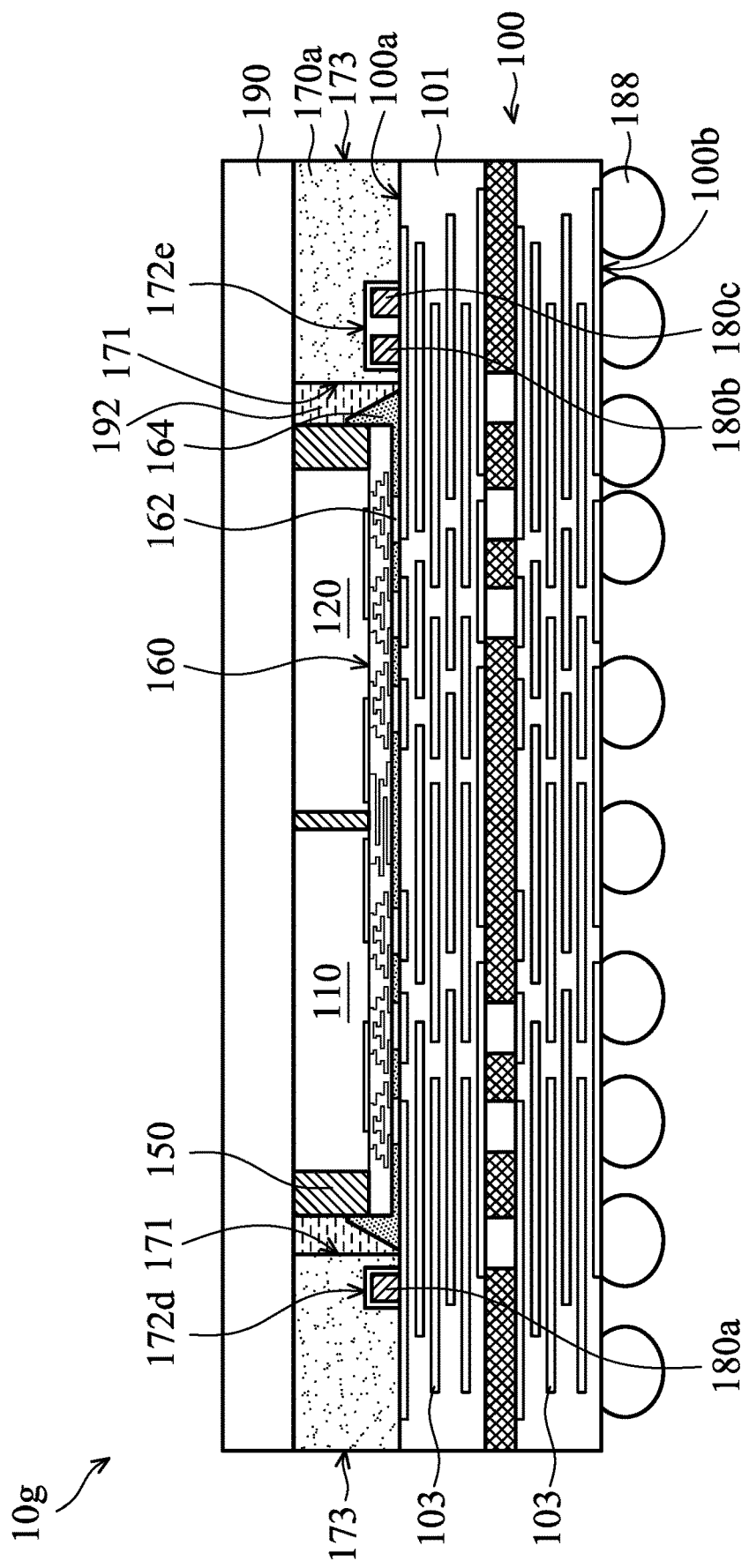
FIG. 6B is a cross-sectional view of an exemplary semiconductor package structure with a ring-type lid structure in accordance with some embodiments.

FIG. 6B is a cross-sectional view of an exemplary semiconductor package structure 10g with a ring-type lid structure in accordance with some embodiments. Descriptions of elements of the embodiments hereinafter that are the same as or similar to those previously described with reference to FIGS. 3 and 6A are omitted for brevity. The semiconductor package structure 10g is similar to the semiconductor package structure 10b shown in FIG. 3. Compared to the semiconductor package structure 10b shown in FIG. 3, the semiconductor package structure 10g further includes a cooling material 192 disposed between and in direct contact with the encapsulating layer 150 and the lid structure 170a.

In some embodiments, the cooling material 192 is also in direct contact with the heat sink 190 and the optional underfill material 164. The cooling material 192 may provide a thermal path for further improving the thermal dissipation properties of the semiconductor dies 110 and 120. The cooling material 192 may also serve as a buffer layer to reduce the stress generated during the fabrication of the semiconductor package structure 10g.

Since the semiconductor package structure 10g has a similar structure to the semiconductor package structure 10b, the semiconductor package structure 10g has substantially the same advantages as semiconductor package structure 10b.

Figure 6C:
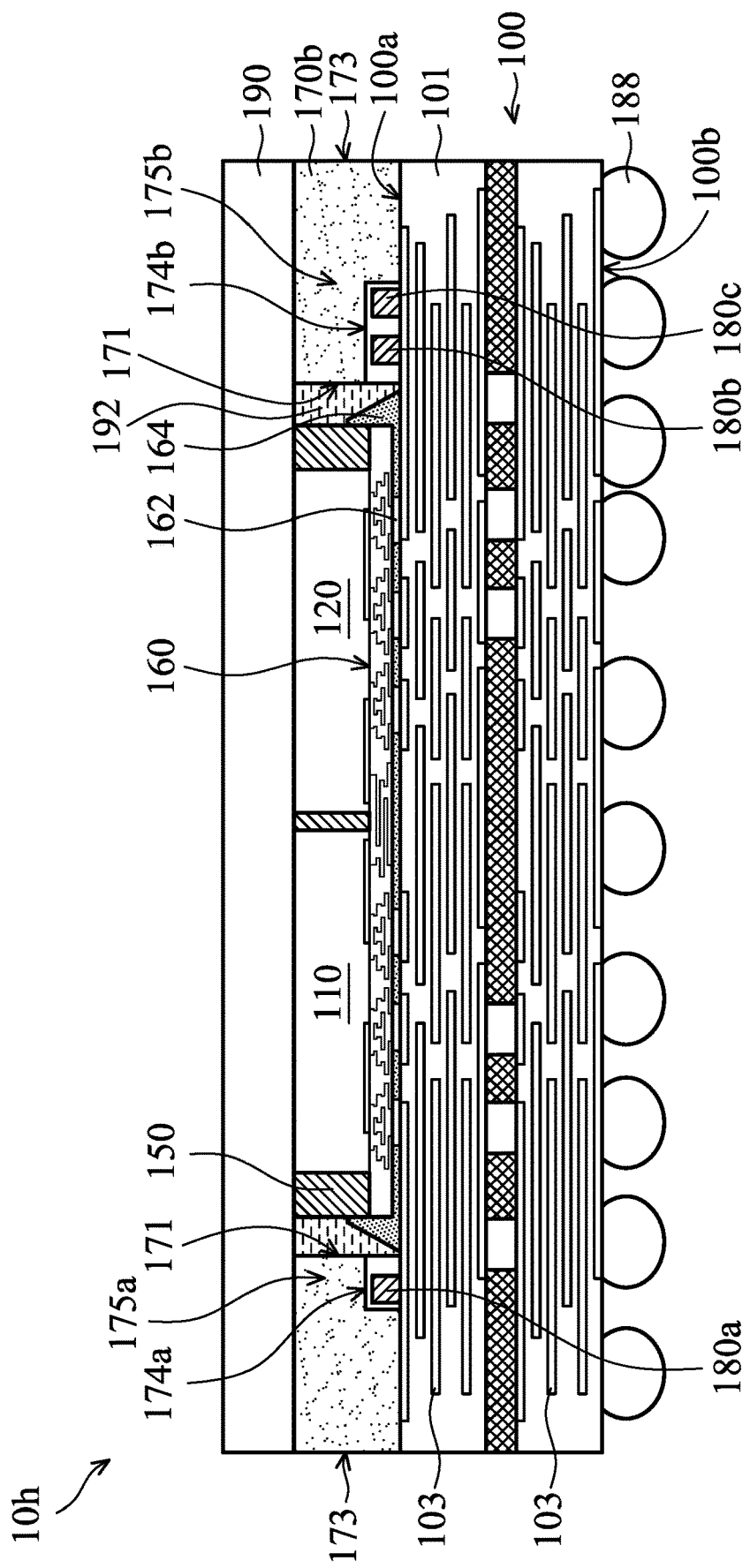
FIG. 6C is a cross-sectional view of an exemplary semiconductor package structure with a ring-type lid structure in accordance with some embodiments.

FIG. 6C is a cross-sectional view of an exemplary semiconductor package structure 10h with a ring-type lid structure in accordance with some embodiments. Descriptions of elements of the embodiments hereinafter that are the same as or similar to those previously described with reference to FIGS. 5A and 6A are omitted for brevity. The semiconductor package structure 10h is similar to the semiconductor package structure 10c shown in FIG. 5A. Compared to the semiconductor package structure 10c shown in FIG. 5A, the semiconductor package structure 10h further includes a cooling material 192 disposed between and in direct contact with the encapsulating layer 150 and the lid structure 170b, so that the recesses 174a and 174b are covered by the cooling material 192.

In some embodiments, the cooling material 192 is also in direct contact with the heat sink 190 and the optional underfill material 164. The cooling material 192 may provide a thermal path for further improving the thermal dissipation properties of the semiconductor dies 110 and 120. The cooling material 192 may also serve as a buffer layer to reduce the stress generated during the fabrication of the semiconductor package structure 10h.

Since the semiconductor package structure 10h has a similar structure to the semiconductor package structure 10c, the semiconductor package structure 10h has substantially the same advantages as semiconductor package structure 10c.

Figure 6D:
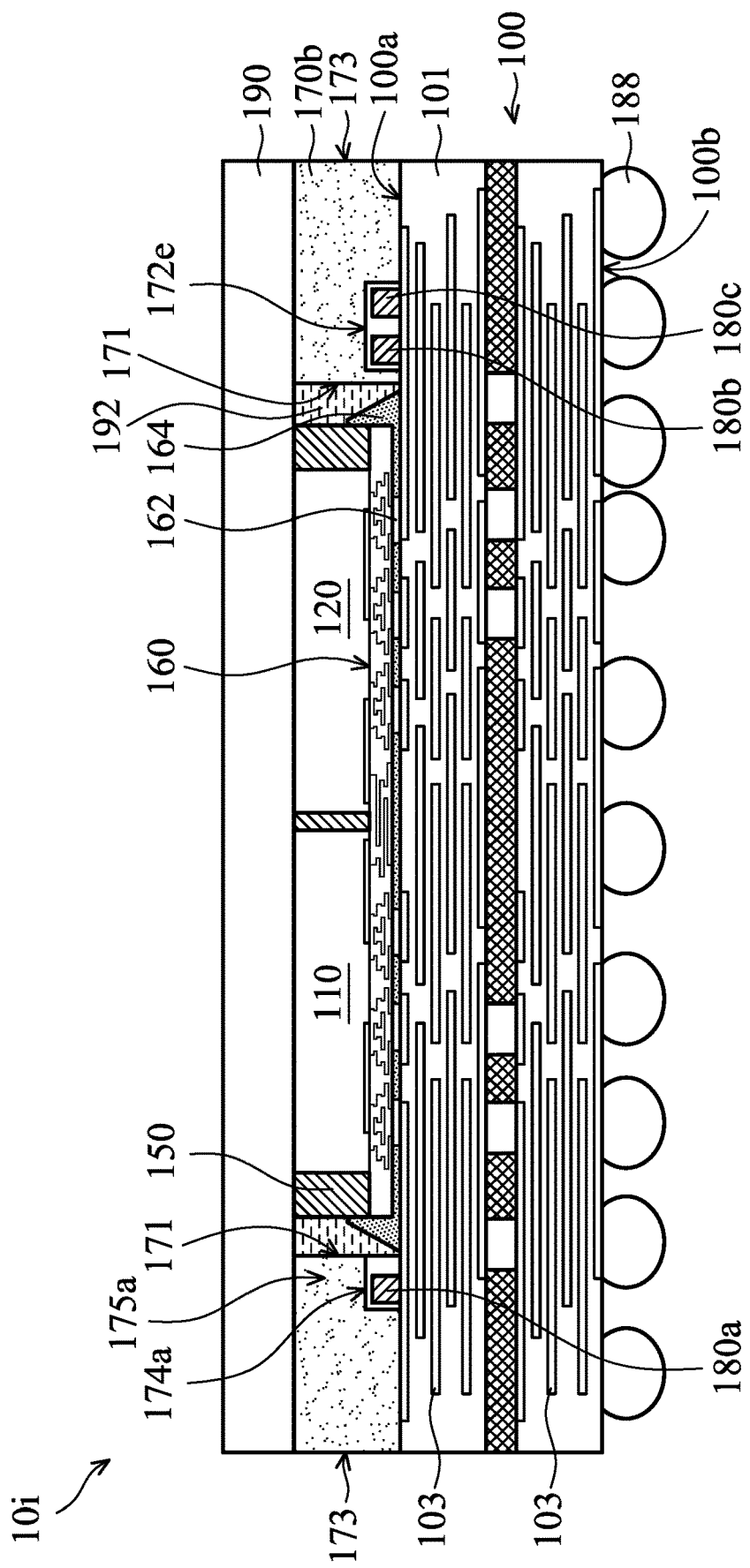
FIG. 6D is a cross-sectional view of an exemplary semiconductor package structure with a ring-type lid structure in accordance with some embodiments.

FIG. 6D is a cross-sectional view of an exemplary semiconductor package structure 10i with a ring-type lid structure in accordance with some embodiments. Descriptions of elements of the embodiments hereinafter that are the same as or similar to those previously described with reference to FIGS. 5B and 6A are omitted for brevity. The semiconductor package structure 10i is similar to the semiconductor package structure 10d shown in FIG. 5B. Compared to the semiconductor package structure 10d shown in FIG. 5B, the semiconductor package structure 10i further includes a cooling material 192 disposed between and in direct contact with the encapsulating layer 150 and the lid structure 170b, so that the recess 174a is covered by the cooling material 192.

In some embodiments, the cooling material 192 is also in direct contact with the heat sink 190 and the optional underfill material 164. The cooling material 192 may provide a thermal path for further improving the thermal dissipation properties of the semiconductor dies 110 and 120. The cooling material 192 may also serve as a buffer layer to reduce the stress generated during the fabrication of the semiconductor package structure 10i.

Since the semiconductor package structure 10i has a similar structure to the semiconductor package structure 10d, the semiconductor package structure 10i has substantially the same advantages as semiconductor package structure 10d.

Figure 6E:
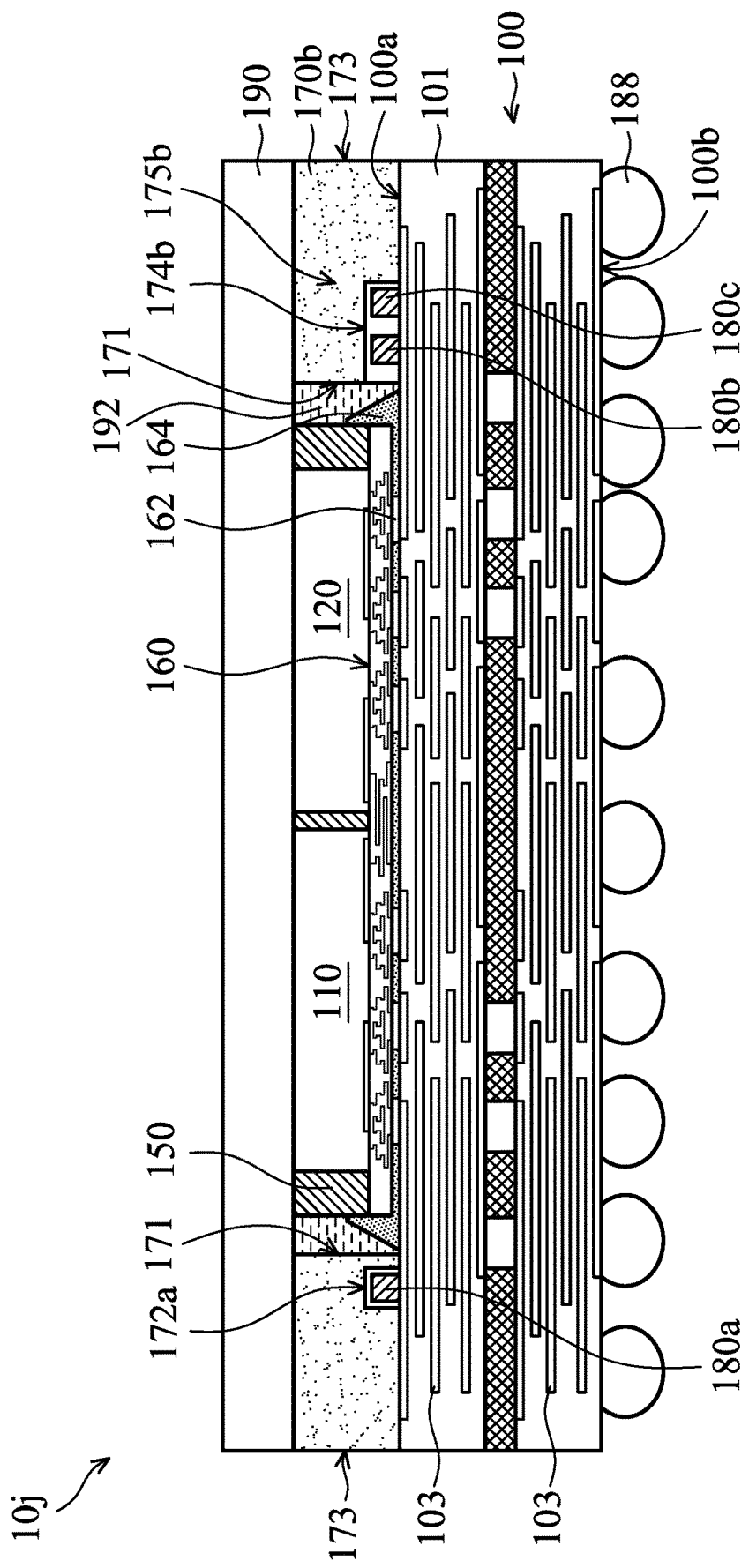
FIG. 6E is a cross-sectional view of an exemplary semiconductor package structure with a ring-type lid structure in accordance with some embodiments.

FIG. 6E is a cross-sectional view of an exemplary semiconductor package structure 10j with a ring-type lid structure in accordance with some embodiments. Descriptions of elements of the embodiments hereinafter that are the same as or similar to those previously described with reference to FIGS. 5C and 6A are omitted for brevity. The semiconductor package structure 10j is similar to the semiconductor package structure 10e shown in FIG. 5C. Compared to the semiconductor package structure 10e shown in FIG. 5C, the semiconductor package structure 10j further includes a cooling material 192 disposed between and in direct contact with the encapsulating layer 150 and the lid structure 170b, so that the recess 174b is covered by the cooling material 192.

In some embodiments, the cooling material 192 is also in direct contact with the heat sink 190 and the optional underfill material 164. The cooling material 192 may provide a thermal path for further improving the thermal dissipation properties of the semiconductor dies 110 and 120. The cooling material 192 may also serve as a buffer layer to reduce the stress generated during the fabrication of the semiconductor package structure 10j.

Since the semiconductor package structure 10j has a similar structure to the semiconductor package structure 10e, the semiconductor package structure 10j has substantially the same advantages as semiconductor package structure 10e.

Figure 7A:
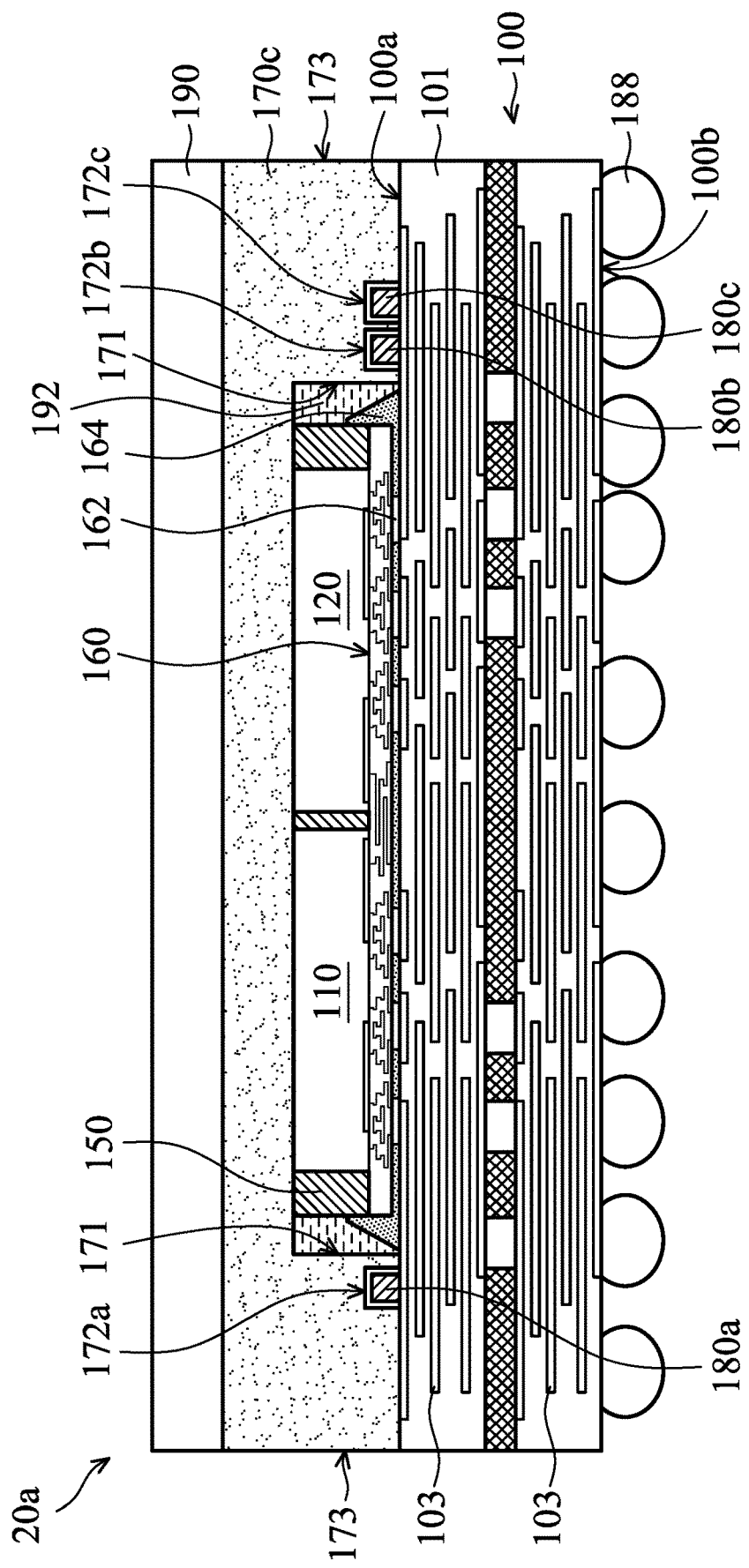
FIG. 7A is a cross-sectional view of an exemplary semiconductor package structure with a cap-type lid structure in accordance with some embodiments.

FIG. 7A is a cross-sectional view of an exemplary semiconductor package structure 20a with a cap-type lid structure in accordance with some embodiments. Descriptions of elements of the embodiments hereinafter that are the same as or similar to those previously described with reference to FIG. 6A are omitted for brevity. The semiconductor package structure 20a is similar to the semiconductor package structure 10f shown in FIG. 6A. Unlike the ring-type lid structure 170a of the semiconductor package structure 10f, the lid structure 170c not only surrounds the encapsulating layer 150, but also caps the top surfaces of the semiconductor dies 110 and 120 and therefore it is also referred to as a cap-type lid structure. Those semiconductor dies 110 and 120 are spaced apart from the heat sink 190 by a portion of the cap-type lid structure 170c.

In some embodiments, two TIM layers (not shown) are respectively disposed on the top and bottom surfaces of the portion of the cap-type lid structure 170c covering the semiconductor dies 110 and 120, so that the heat generated from those semiconductor dies 110 and 120 can be dissipated through the TIM layers, the cap-type lid structure 170c and the heat sink 190.

Compared to the ring-type lid structure 170a of the semiconductor package structure 10f shown in FIG. 6A, the cap-type lid structure 170c provides a higher structural strength for further preventing package warpage during fabrication of the semiconductor package structure 20a. Since the semiconductor package structure 20a has a similar structure to the semiconductor package structure 10f, the semiconductor package structure 20a has substantially the same advantages as semiconductor package structure 10f.

Figure 7B:
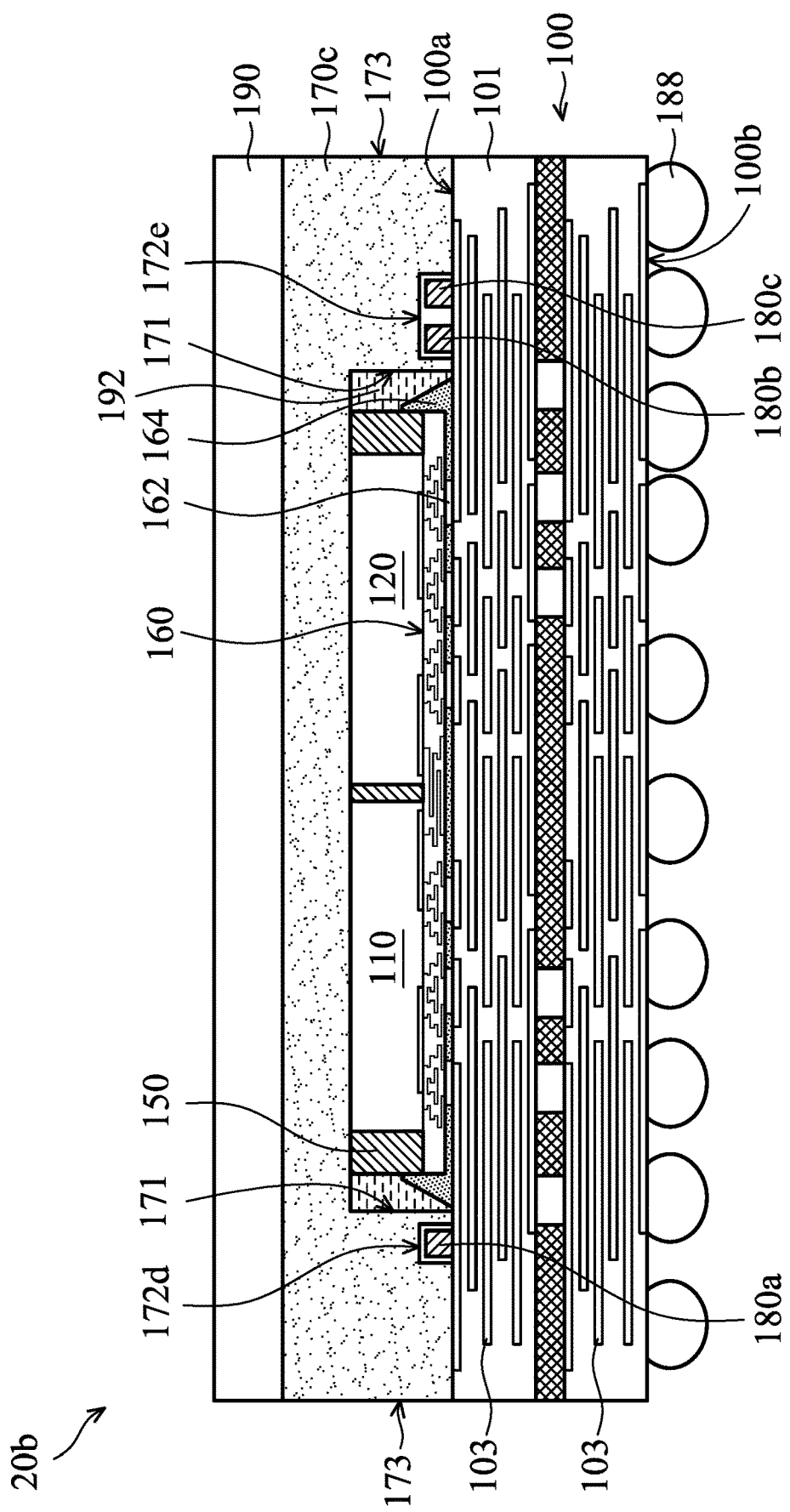
FIG. 7B is a cross-sectional view of an exemplary semiconductor package structure with a cap-type lid structure in accordance with some embodiments.

FIG. 7B is a cross-sectional view of an exemplary semiconductor package structure 20b with a cap-type lid structure in accordance with some embodiments. Descriptions of elements of the embodiments hereinafter that are the same as or similar to those previously described with reference to FIG. 6B are omitted for brevity. The semiconductor package structure 20b is similar to the semiconductor package structure 10g shown in FIG. 6B. Unlike the semiconductor package structure 10g, the semiconductor package structure 20b has a cap-type lid structure 170c surrounds the encapsulating layer 150 and caps the top surfaces of the semiconductor dies 110 and 120, so that semiconductor dies 110 and 120 are spaced apart from the heat sink 190 by a portion of the cap-type lid structure 170c.

In some embodiments, two TIM layers (not shown) are respectively disposed on the top and bottom surfaces of the portion of the cap-type lid structure 170c covering the semiconductor dies 110 and 120, so that the heat generated from those semiconductor dies 110 and 120 can be dissipated through the TIM layers, the cap-type lid structure 170c and the heat sink 190.

Compared to the ring-type lid structure 170a of the semiconductor package structure 10g shown in FIG. 6B, the cap-type lid structure 170c provides a higher structural strength for further preventing package warpage during fabrication of the semiconductor package structure 20b. Since the semiconductor package structure 20b has a similar structure to the semiconductor package structure 10g, the semiconductor package structure 20b has substantially the same advantages as semiconductor package structure 10g.

Figure 7C:
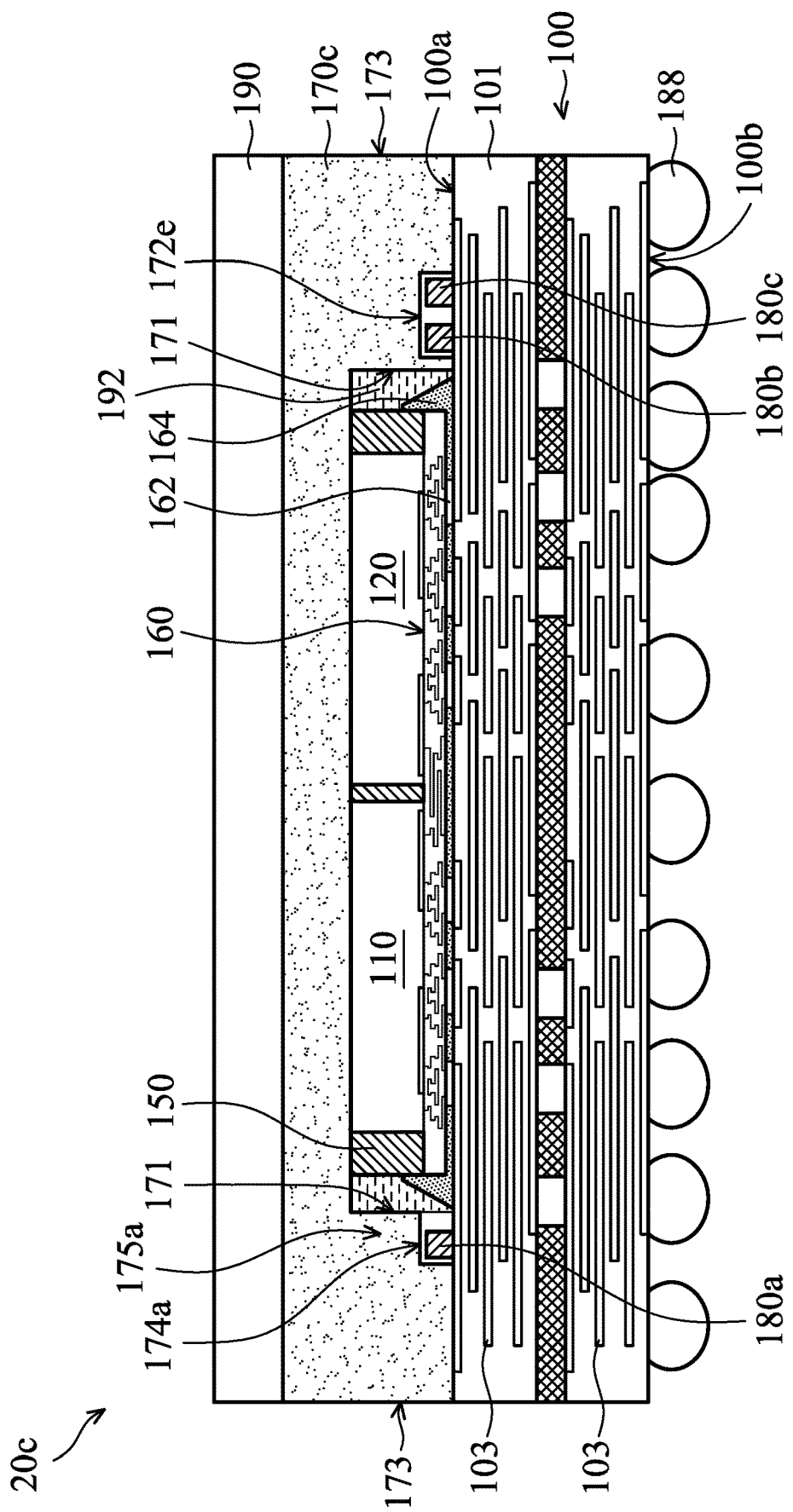
FIG. 7C is a cross-sectional view of an exemplary semiconductor package structure with a cap-type lid structure in accordance with some embodiments.

FIG. 7C is a cross-sectional view of an exemplary semiconductor package structure 20c with a cap-type lid structure in accordance with some embodiments. Descriptions of elements of the embodiments hereinafter that are the same as or similar to those previously described with reference to FIG. 6D are omitted for brevity. The semiconductor package structure 20c is similar to the semiconductor package structure 10i shown in FIG. 6D. Unlike the semiconductor package structure 10i, the semiconductor package structure 20c has a cap-type lid structure 170c surrounds the encapsulating layer 150 and caps the top surfaces of the semiconductor dies 110 and 120, so that semiconductor dies 110 and 120 are spaced apart from the heat sink 190 by a portion of the cap-type lid structure 170c.

In some embodiments, two TIM layers (not shown) are respectively disposed on the top and bottom surfaces of the portion of the cap-type lid structure 170c covering the semiconductor dies 110 and 120, so that the heat generated from those semiconductor dies 110 and 120 can be dissipated through the TIM layers, the cap-type lid structure 170c and the heat sink 190.

Compared to the ring-type lid structure 170b of the semiconductor package structure 10i shown in FIG. 6D, the cap-type lid structure 170c provides a higher structural strength for further preventing package warpage during fabrication of the semiconductor package structure 20c. Since the semiconductor package structure 20c has a similar structure to the semiconductor package structure 10i, the semiconductor package structure 20c has substantially the same advantages as semiconductor package structure 10i.

Figure 7D:
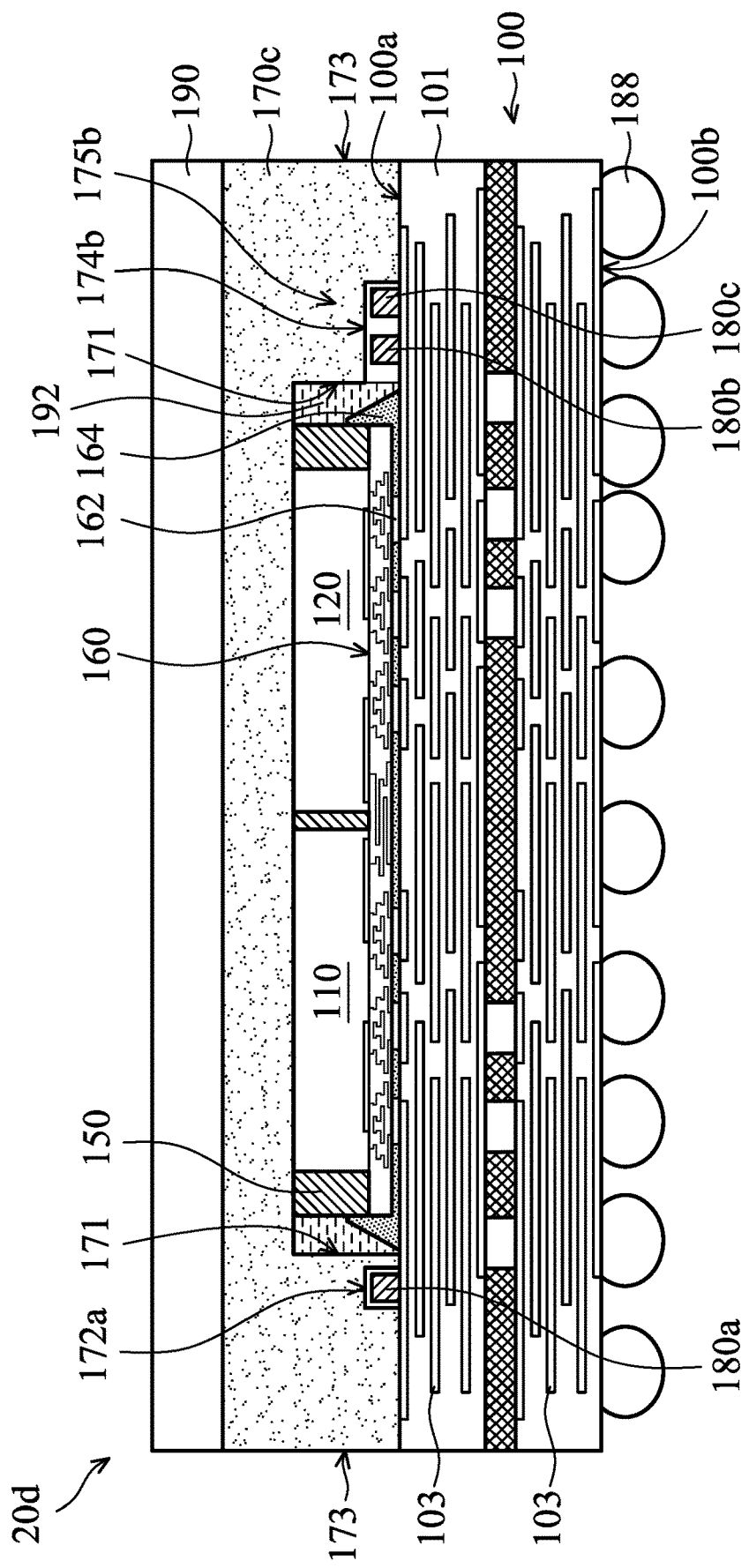
FIG. 7D is a cross-sectional view of an exemplary semiconductor package structure with a cap-type lid structure in accordance with some embodiments.

FIG. 7D is a cross-sectional view of an exemplary semiconductor package structure 20d with a cap-type lid structure in accordance with some embodiments. Descriptions of elements of the embodiments hereinafter that are the same as or similar to those previously described with reference to FIG. 6E are omitted for brevity. The semiconductor package structure 20d is similar to the semiconductor package structure 10j shown in FIG. 6E. Unlike the semiconductor package structure 10j, the semiconductor package structure 20d has a cap-type lid structure 170c surrounds the encapsulating layer 150 and caps the top surfaces of the semiconductor dies 110 and 120, so that semiconductor dies 110 and 120 are spaced apart from the heat sink 190 by a portion of the cap-type lid structure 170c.

In some embodiments, two TIM layers (not shown) are respectively disposed on the top and bottom surfaces of the portion of the cap-type lid structure 170c covering the semiconductor dies 110 and 120, so that the heat generated from those semiconductor dies 110 and 120 can be dissipated through the TIM layers, the cap-type lid structure 170c and the heat sink 190.

Compared to the ring-type lid structure 170b of the semiconductor package structure 10j shown in FIG. 6E, the cap-type lid structure 170c provides a higher structural strength for further preventing package warpage during fabrication of the semiconductor package structure 20d. Since the semiconductor package structure 20d has a similar structure to the semiconductor package structure 10j, the semiconductor package structure 20d has substantially the same advantages as semiconductor package structure 10j.

According to the foregoing embodiments, the ring-type lid structure includes at least one opening and/or at least one recess for placement of one or more electronic components. As a result, the width of the ring-type lid structure can be greatly increased, thereby enhancing the structural strength of the ring-type lid structure to prevent package warpage during fabrication of the semiconductor package structure. Since such a ring-type lid structure exposes one or more semiconductor dies in the semiconductor package structure, the heat sink on the ring-type lid structure can be in contact with the semiconductor dies, so as to improve or maintain the thermal dissipation property.

According to the foregoing embodiments, the cap-type lid structure also includes at least one opening and/or at least one recess for placement of one or more electronic components, so that the cap-type lid structure can provide a high structural strength to prevent package warpage during fabrication of the semiconductor package structure further.

According to the foregoing embodiments, the use of the cooling material in direct contact with the encapsulating layer, the lid structure, and the heat sink provides a thermal path for improving the thermal dissipation properties even further. Moreover, the cooling material can serve as a buffer layer to reduce the stress generated during the fabrication of the semiconductor package structure.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a package substrate having a first surface and a second surface opposite to the first surface;
   at least one semiconductor die on the first surface of the package substrate and surrounded by an encapsulating layer;
   a lid structure surrounding and spaced apart from the encapsulating layer, wherein the lid structure comprises a first opening that is covered by the first surface of the package substrate, wherein the first opening of the lid structure has a rectangular or circular shape as viewed from a top-view perspective, wherein the lid structure further comprises a second opening that is covered by the first surface of the package substrate, and wherein the second opening has an area that is different from that of the first opening as viewed from a top-view perspective; and
   a first electronic component over the first surface of the package substrate and arranged within the first opening of the lid structure.

2. The semiconductor package structure as claimed in claim 1 further comprises a plurality of conductive structures disposed on the second surface of the package substrate and electrically coupled to the semiconductor die through the package substrate.

3. The semiconductor package structure as claimed in claim 1 further comprises a second electronic component over the first surface of the package substrate and arranged within the first opening of the lid structure.

4. The semiconductor package structure as claimed in claim further comprises a second electronic component and a third electronic component over the first surface of the package substrate, wherein the area of the second opening is greater than that of the first opening, and the second electronic component and the third electronic component are arranged within the second opening of the lid structure.

5. The semiconductor package structure as claimed in claim 1, further comprising a second electronic component over the first surface of the package substrate, wherein the lid structure further comprises a recess that is inwardly extended from an inner sidewall of the lid structure to form an eave portion covering the second electronic component.

6. The semiconductor package structure as claimed in claim 5, further comprising a third electronic component over the first surface of the package substrate, wherein the third electronic component is covered by the eave portion.

7. The semiconductor package structure as claimed in claim 5 further comprises a third electronic component over the first surface of the package substrate, wherein the third electronic component is arranged within the first opening of the lid structure.

8. The semiconductor package structure as claimed in claim 1, further comprising a cooling material between and in direct contact with the encapsulating layer and the lid structure.

9. A semiconductor package structure, comprising:
   a package substrate having a first surface and a second surface opposite to the first surface;
   at least one semiconductor die on the first surface of the package substrate and surrounded by an encapsulating layer;
   a lid structure surrounding the encapsulating layer and capping a top surface of the semiconductor die, wherein the lid structure comprises a first opening that is covered by the first surface of the package substrate, wherein the first opening of the lid structure has a rectangular or circular shape as viewed from a top-view perspective, wherein the lid structure further comprises a second opening that is covered by the first surface of the package substrate, and wherein the second opening has an area that is different from that of the first opening as viewed from a top-view perspective; and
   a first electronic component over the first surface of the package substrate and arranged within the first opening of the lid structure.

10. The semiconductor package structure as claimed in claim 9, further comprising a plurality of conductive structures disposed on the second surface of the package substrate and electrically coupled to the semiconductor die through the package substrate.

11. The semiconductor package structure as claimed in claim 9 further comprises a second electronic component over the first surface of the package substrate and arranged within the first opening of the lid structure.

12. The semiconductor package structure as claimed in claim 9 further comprises a second electronic component and a third electronic component over the first surface of the package substrate, and wherein the area of the second opening is greater than that of the first opening, and the second electronic component and the third electronic component are arranged within the second opening of the lid structure.

13. The semiconductor package structure as claimed in claim 9, further comprising a second electronic component over the first surface of the package substrate and between an inner sidewall of the lid structure and the encapsulating layer.

14. The semiconductor package structure as claimed in claim 9, further comprising a cooling material between and in direct contact with the encapsulating layer and the lid structure.

15. A semiconductor package structure, comprising:
   a package substrate having a first surface and a second surface opposite to the first surface;
   at least one semiconductor die on the first surface of the package substrate and surrounded by an encapsulating layer;
   a lid structure surrounding and spaced apart from the encapsulating layer, wherein the lid structure comprises a first recess that is inwardly extended from an inner sidewall of the lid structure to form a first eave portion, wherein the first recess of the lid structure has a rectangular or circular shape as viewed from a top-view perspective, wherein the lid structure further comprises a second recess that is inwardly extended from the inner sidewall of the lid structure to form a second eave portion, and wherein the second recess has an area that is different from that of the first recess as viewed from a top-view perspective; and
   a first electronic component over the first surface of the package substrate and covered by the first eave portion of the lid structure.

16. The semiconductor package structure as claimed in claim 15 further comprises a plurality of conductive structures disposed on the second surface of the package substrate and electrically coupled to the semiconductor die through the package substrate.

17. The semiconductor package structure as claimed in claim 15, further comprising a second electronic component over the first surface of the package substrate and covered by the first eave portion of the lid structure.

18. The semiconductor package structure as claimed in claim 15 further comprises a second electronic component and a third electronic component over the first surface of the package substrate, and wherein the area of the second recess is greater than that of the first recess, and the second electronic component and the third electronic component are covered by the second eave portion.

19. The semiconductor package structure as claimed in claim 15, further comprising a cooling material between and in direct contact with the encapsulating layer and the lid structure.

* * * * *